(12) United States Patent
Ueda

(10) Patent No.: US 12,720,998 B2
(45) Date of Patent: Aug. 25, 2026

(54) LIGHT-EMITTING ELEMENT AND DISPLAY DEVICE

(71) Applicant: SHARP KABUSHIKI KAISHA, Sakai City (JP)

(72) Inventor: Masaya Ueda, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 588 days.

(21) Appl. No.: 18/022,362

(22) PCT Filed: Sep. 1, 2020

(86) PCT No.: PCT/JP2020/032976
§ 371 (c)(1),
(2) Date: Feb. 21, 2023

(87) PCT Pub. No.: WO2022/049612
PCT Pub. Date: Mar. 10, 2022

(65) Prior Publication Data
US 2023/0320124 A1 Oct. 5, 2023

(51) Int. Cl.
*H10K 59/80* (2023.01)
*H10K 50/115* (2023.01)
(Continued)

(52) U.S. Cl.
CPC ..... *H10K 59/80522* (2023.02); *H10K 50/115* (2023.02); *H10K 50/167* (2023.02);
(Continued)

(58) Field of Classification Search
CPC ... H10K 59/80522; H10K 50/167; G09F 9/30
See application file for complete search history.

(56) References Cited

U.S. PATENT DOCUMENTS

2005/0062039 A1* 3/2005 Kim ................. H10K 59/80523 257/40
2012/0228667 A1* 9/2012 Boerner ............. H10K 59/8721 257/43
(Continued)

FOREIGN PATENT DOCUMENTS

JP 2002063801 A * 2/2002
JP 2019160796 A 9/2019

OTHER PUBLICATIONS

JP 2002-063801 A machine translation (Year: 2002).*

*Primary Examiner* — Vincent Wall
(74) *Attorney, Agent, or Firm* — ScienBiziP, P.C.

(57) ABSTRACT

A light-emitting element includes a first electrode, a second electrode, and a functional layer provided between the first electrode and the second electrode. Moreover, the light-emitting element includes: a third electrode provided to the functional layer through a first insulating film; a fourth electrode provided to the functional layer through a second insulating film; a stress applying unit made of a piezoelectric material, and applying stress to the functional layer in response to application of a voltage from the third electrode and the fourth electrode; a power supply connected to the third electrode and the fourth electrode; a detecting unit detecting a condition of the functional layer; a storage unit storing predetermined threshold value information; and a control unit controlling the power supply in accordance with a result of the detection obtained from the detecting unit and the predetermined threshold information stored in the storage unit.

6 Claims, 19 Drawing Sheets

(51) Int. Cl.
*H10K 50/16* (2023.01)
*H10K 59/12* (2023.01)

(52) U.S. Cl.
CPC ............. *H10K 59/12* (2023.02); *H10K 59/80* (2023.02); *H10K 59/80521* (2023.02); *H10K 59/80515* (2023.02)

(56) References Cited

U.S. PATENT DOCUMENTS

| | | | | |
|---|---|---|---|---|
| 2016/0071463 | A1* | 3/2016 | Takahashi | H10D 30/6755 327/109 |
| 2016/0179276 | A1* | 6/2016 | Nathan | G06F 3/0443 345/174 |
| 2016/0232834 | A1* | 8/2016 | Kimura | G09G 3/325 |
| 2019/0280235 | A1 | 9/2019 | Kim et al. | |
| 2021/0119164 | A1 | 4/2021 | Kim et al. | |
| 2021/0288281 | A1* | 9/2021 | Li | C01B 25/087 |
| 2022/0173171 | A1* | 6/2022 | Kanehiro | H10K 50/16 |
| 2023/0309360 | A1* | 9/2023 | Ueda | H05B 33/14 |
| 2023/0320124 | A1* | 10/2023 | Ueda | H10K 50/167 257/40 |

* cited by examiner

DA
SPb
SPg
SPr
Xb
Xg
Xr
23
FE
ZF
TE
CE
DL
15
GE
TR
30
28
27
26
25
24
22
21
20
18
16
3
12
6
5
4

DA
SPb
SPg
SPr
Xb
Xg
Xr
43
43
OE
DL
GE 15
TR
39
28
27
26
25
24
22
21
20
18
16
3
12
8
5
4

(a)

(b)

(c)

(d)

Xb
Xg
Xr
25
24d
24cb
24b
24a
22
43d
FE
51
TE
43
24cg
21
24cr

LIGHT-EMITTING ELEMENT AND DISPLAY DEVICE

TECHNICAL FIELD

The disclosure relates to a light-emitting element and a display device including the light-emitting element.

BACKGROUND ART

In recent years, light-emitting display devices have been developed and practically used instead of non-light-emitting liquid crystal display devices. Such a display device, which does not require a backlit apparatus, includes, for example, light-emitting elements such as organic light-emitting diodes (OLEDs) and quantum-dot light-emitting diodes (QLEDs). The light-emitting elements are provided for respective pixels.

Moreover, the known light-emitting element described above includes: a first electrode; a second electrode; and a functional layer provided between the first electrode and the second electrode, and at least including a light-emitting layer (see, for example, Patent Document 1 below).

CITATION LIST

Patent Literature

Patent Document 1: Japanese Unexamined Patent Application Publication No. 2019-160796

SUMMARY

Technical Problems

However, the above known light-emitting element and display device could develop such problems as a decrease in light emission efficiency caused by deterioration of the functional layer over time, and the resulting decrease in output of light. The deteriorating functional layer could also cause a decrease in light emission capability of the light-emitting element and the display device.

In view of the above problems, it is an object of the disclosure to provide a light-emitting element and a display device that can reduce a decrease in output of light and emit the light in high quality, even though a functional layer deteriorates over time.

Solution to Problems

In order to achieve the above object, a light-emitting element according to the disclosure includes a first electrode, a second electrode, and a functional layer provided between the first electrode and the second electrode. The light-emitting element includes:

a third electrode provided to the functional layer through a first insulating film;

a fourth electrode provided to the functional layer through a second insulating film;

a stress applying unit made of a piezoelectric material, and configured to apply stress to the functional layer in response to application of a voltage from the third electrode and the fourth electrode;

a power supply connected to the third electrode and the fourth electrode;

a detecting unit configured to detect a condition of the functional layer;

a storage unit configured to store predetermined threshold value information; and a control unit configured to control the power supply in accordance with a result of the detection obtained from the detecting unit and the predetermined threshold information stored in the storage unit.

The above light-emitting element includes the stress applying unit made of a piezoelectric material. Moreover, in response to application of a voltage from: the third electrode provided across the first insulating film from the functional layer; and the fourth electrode provided across the second insulating film from the functional layer, this stress applying unit applies stress to the functional layer. Furthermore, the detecting unit detects a condition of the functional layer. The control unit controls the voltage to be applied from the power supply to the third electrode and the fourth electrode, in accordance with a result of the detection obtained from the detecting unit and the predetermined threshold value information stored in the storage unit. Such features can reduce a decrease in output of light and emit the light in high quality, even though the functional layer deteriorates over time. As a result, the light-emitting element can emit light of high quality, even though the functional layer deteriorates over time.

Moreover, a display device according to the disclosure includes the light-emitting element according to any one of the light-emitting elements.

The light-emitting element includes a first light-emitting element, a second light-emitting element, and a third light-emitting element emitting light in different colors.

The above display device includes any of the above light-emitting elements, and includes a first light-emitting element, a second light-emitting element, and a third light-emitting element each emitting light in different colors. Thanks to such features, the light-emitting element can emit light of high quality, even though the functional layer deteriorates over time. Moreover, the display device includes the above first to third light-emitting elements. Such a feature can readily allow the display device to display a colored image of high quality.

Advantageous Effect of Disclosure

The disclosure can provide a light-emitting element and a display device that can reduce a decrease in output of light and emit the light in high quality, even though a functional layer deteriorates over time.

BRIEF DESCRIPTION OF DRAWINGS

FIG. 4 is a drawing specifically illustrating an exemplary configuration of a light-emitting element in FIG. 2.

FIG. 8(*a*)

shows an example of an energy level in the light-emitting element before deterioration over time occurs. FIG. 8(*b*) shows an example of an energy level in the light-emitting element after deterioration over time occurs. FIG. 8(*c*) shows an example of an energy level after compensation is performed.

FIG. 9(*a*) is a diagram showing an example of a simulation result of a color gamut of light emitted from a comparative product. FIG. 9(*b*) is a diagram showing an example of a simulation result of a color gamut of light emitted from a product according to this embodiment.

FIG. 13(*a*) to FIG. 13(*d*) illustrate a sequence of the steps to produce the essential configuration.

DESCRIPTION OF EMBODIMENTS

Figure 1:
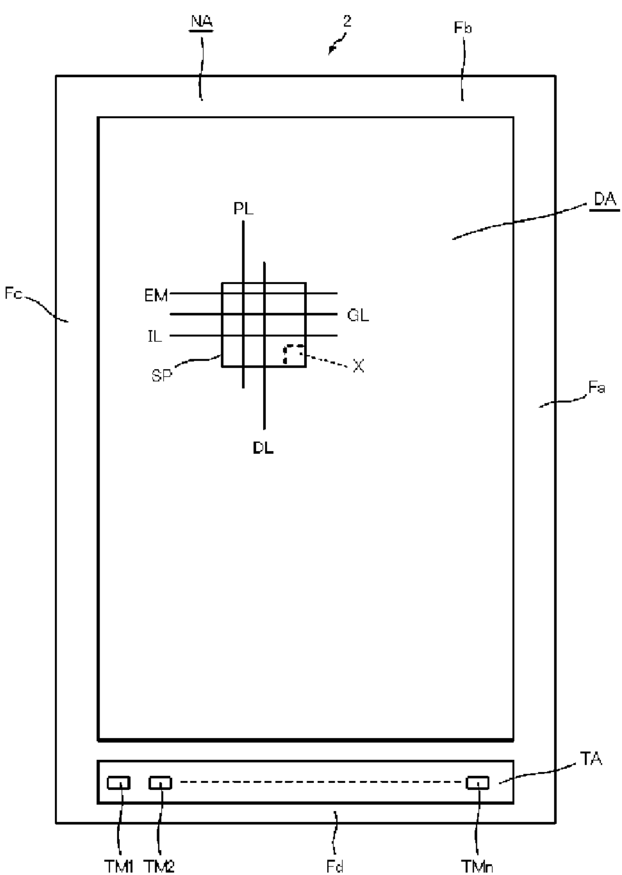
FIG. 1 is a schematic view illustrating a configuration of a display device including light-emitting elements according to a first embodiment of the disclosure.

Described below in detail are embodiments of the disclosure, with reference to the drawings. Note that the disclosure shall not be limited to the embodiments below. In the description below, the term “same layer” means that constituent features are formed in the same process (in the same film forming process). The term “layer below” means that a constituent feature is formed in a previous process before a comparative layer. The term “layer above” means that a constituent feature is formed in a successive process after a comparative layer. Moreover, dimensions of the constituent members in the drawings do not faithfully represent actual dimensions of the constituent members or dimensional ratios between the constituent members.

First Embodiment

Figure 2:
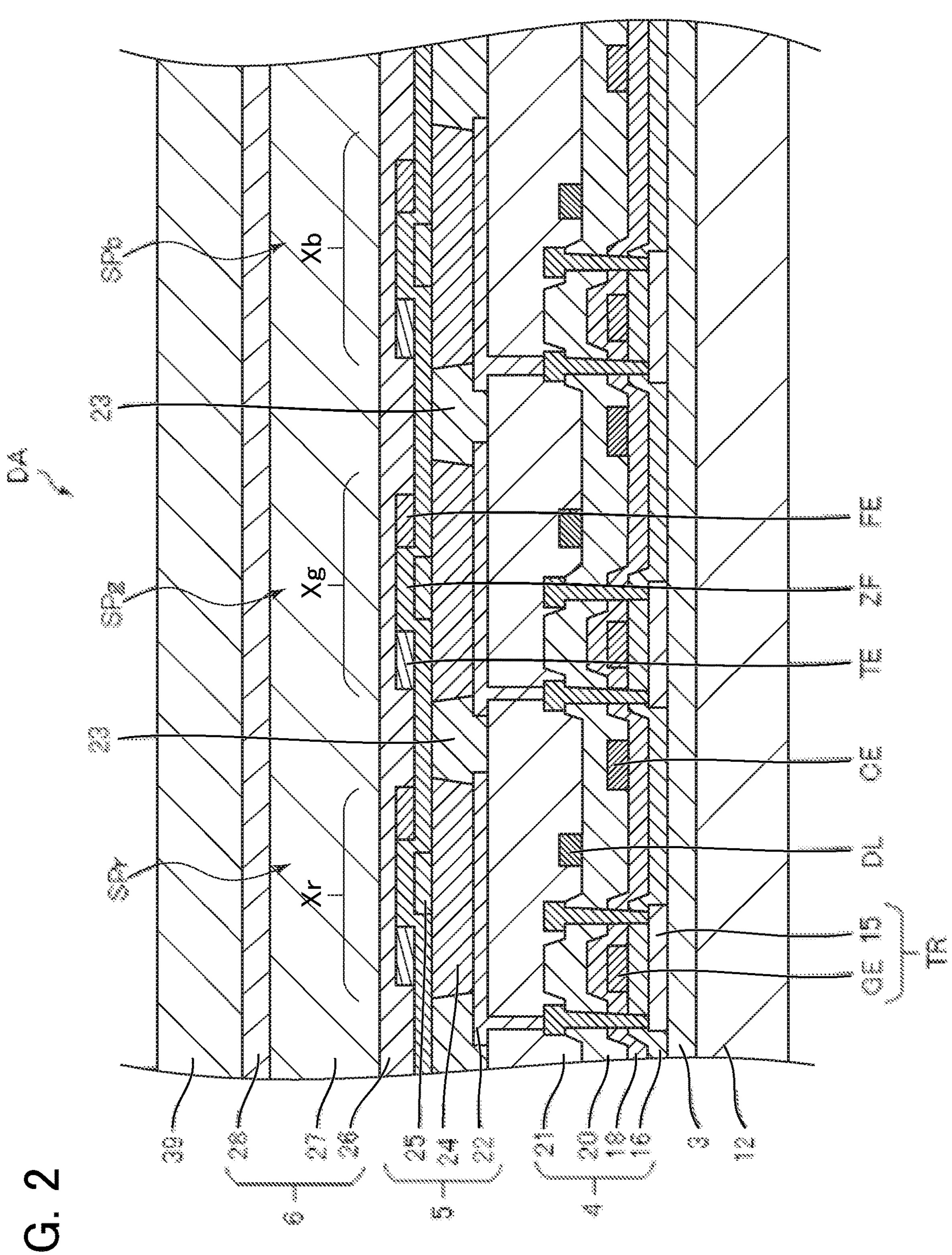
FIG. 2 is a drawing illustrating an essential configuration of the display device in FIG. 1.
Figure 3:
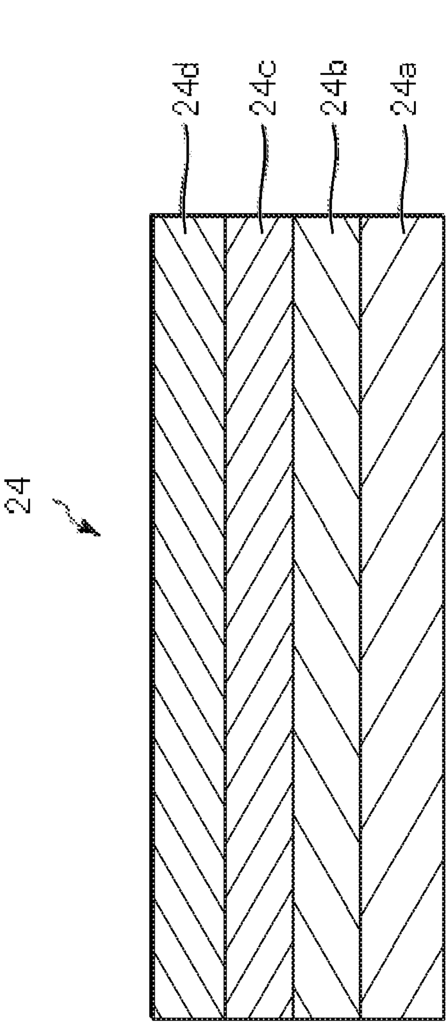
FIG. 3 is a drawing illustrating a specific configuration of a functional layer in FIG. 2.
Figure 4:
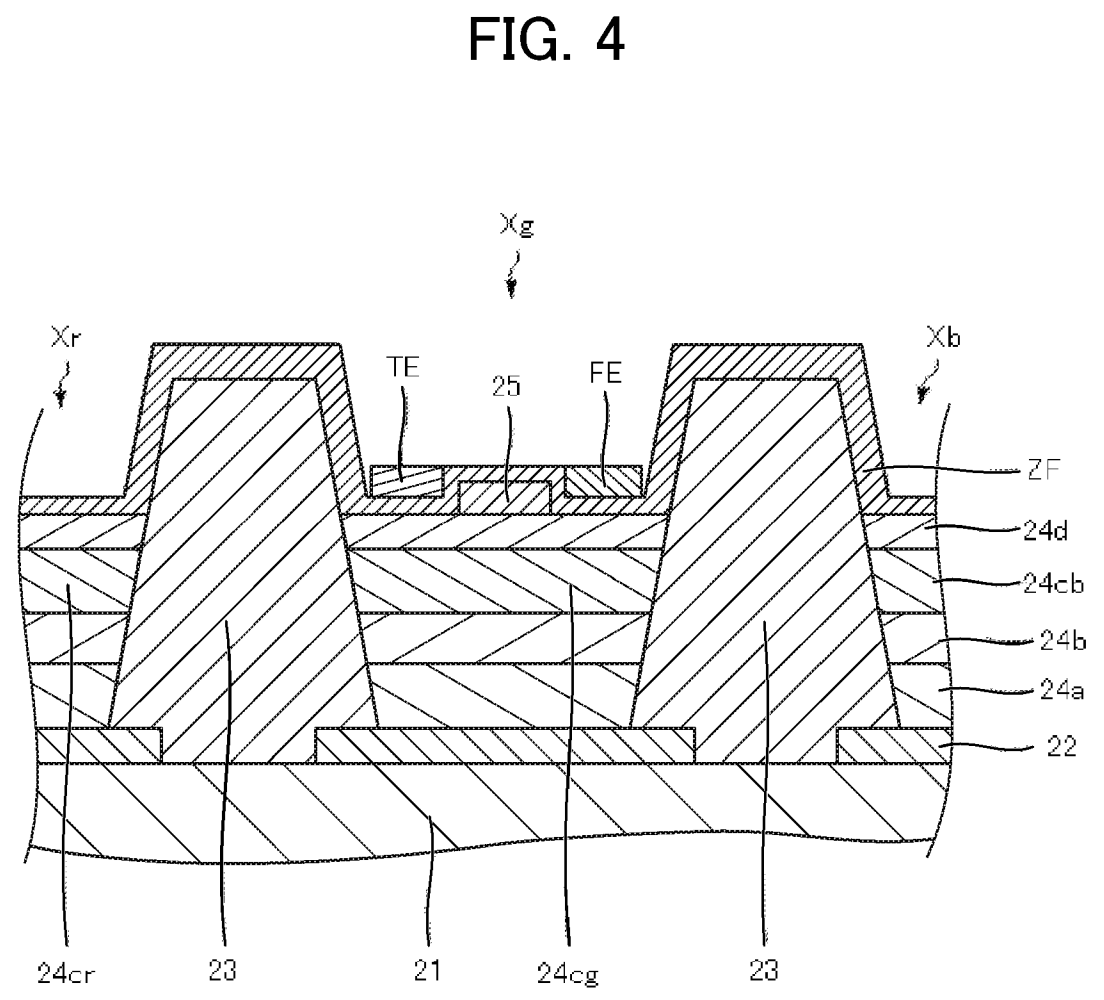
Figure 5:
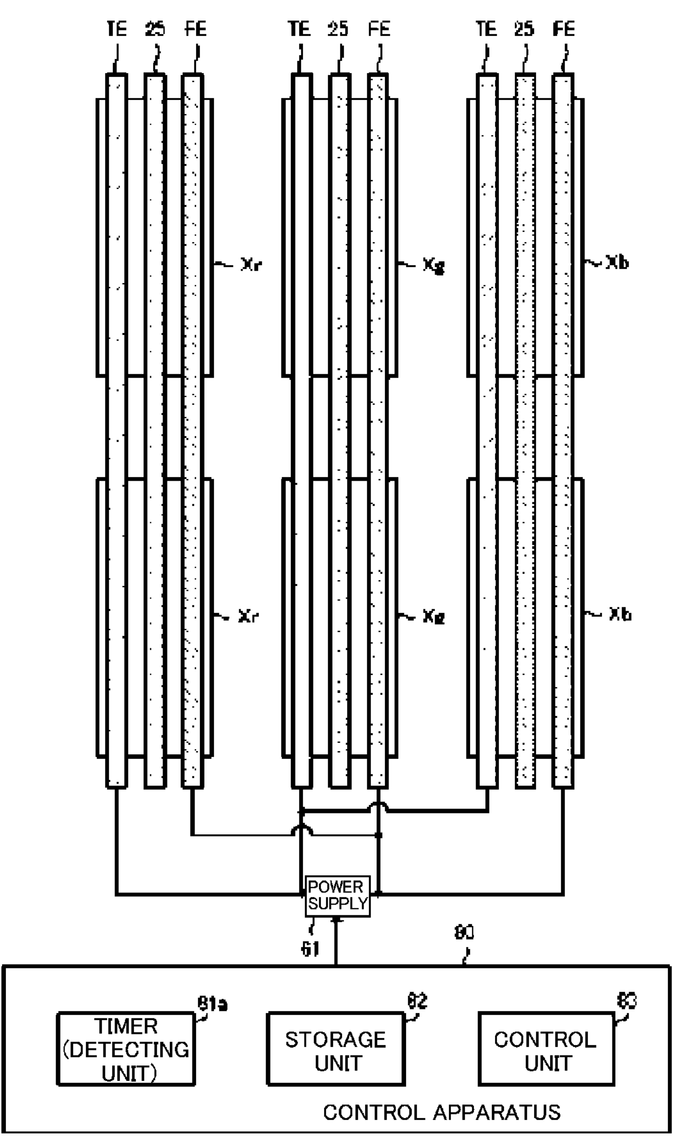
FIG. 5 is a plan view of an essential configuration of the light-emitting element.

FIG. 1 is a schematic view illustrating a configuration of a display device including light-emitting elements according to a first embodiment of the disclosure. FIG. 2 is a drawing illustrating an essential configuration of the display device in FIG. 1. FIG. 3 is a drawing illustrating a specific configuration of a functional layer in FIG. 2. FIG. 4 is a drawing specifically illustrating an exemplary configuration of a light-emitting element in FIG. 2. FIG. 5 is a plan view of an essential configuration of the light-emitting element.

As illustrated in FIGS. 1 and 2, a display device 2 of this embodiment includes: a barrier layer 3; a thin-film-transistor (TFT) layer 4; a light-emitting-element layer 5 of a top-emission type; and a sealing layer 6, all of which are provided in the stated order above the base material 12. A display region DA is provided with a plurality of subpixels SP. A picture-frame region NA surrounding the display region DA is made of four side edges Fa to Fd. The side edge Fd is provided with a terminal unit TA on which an electronic circuit board (such as an IC ship and an FPC) is mounted. The terminal unit TA includes a plurality of terminals TM1, TM2, and TMn (n is an integer of 2 or greater). These plurality of terminals TM1, TM2, and TMn are, as illustrated in FIG. 1, provided along one of four sides of the display region DA. Note that each of the side edges Fa to Fd can be provided with a driver circuit (not shown).

Moreover, the plurality of subpixels SP include a first subpixel, a second subpixel, and a third subpixel each emitting light in different colors. Specifically, for example, the first subpixel is a red subpixel SPr emitting a red light, the second subpixel is a green subpixel SPg emitting a green light, and the third subpixel is a blue subpixel SPb emitting a blue light. These subpixel SPr, subpixel SPg, and subpixel SPb are different from each other only in the structure of a light-emitting layer (e.g., a quantum-dot light-emitting layer) included in a light-emitting element to be described later. Otherwise, the subpixels SPr, SPg, and SPb are the same in structure. That is, each of the subpixels SP includes: a first electrode; a second electrode; and a functional layer provided between the first electrode and the second electrode (as will be described in detail).

The base material 12 may be either a glass substrate or a flexible substrate including a resin film such as polyimide. Moreover, the base material 12 may be a flexible substrate including: two resin films; and an inorganic insulating film sandwiched between these resin films. Furthermore, on a lower surface of the base material 12, a film made of, for example, PET may be attached. In addition, if the base material 12 is a flexible substrate, the display device 2 can be a flexible display device. Otherwise, the base material 12 may be made of a material mixture containing several kinds of materials mixed together. The use of such a material mixture makes it possible to readily change such properties of the base material 12 as an elastic constant and an optical constant.

The barrier layer 3 is a layer to keep the thin-film-transistor layer 4 and the light-emitting-element layer 5 from such foreign objects as water and oxygen. For example, the barrier layer 3 may be a silicon oxide film, a silicon nitride film, or a silicon oxide nitride film formed by the CVD. Alternatively, the barrier layer 3 may be a multilayer film of these films.

As illustrated in FIG. 2, the thin-film-transistor layer 4 includes: a semiconductor layer (including a semiconductor film 15) above the barrier layer 3; an inorganic insulating film 16 (a gate insulating film) above the semiconductor layer; a first metal layer (including a gate electrode GE) above the inorganic insulating film 16; an inorganic insulating film 18 above the first metal layer; a second metal layer (including a capacitance electrode CE) above the inorganic insulating film 18; an inorganic insulating film 20 above the second metal layer; a third metal layer (including a data signal line DL) above the inorganic insulating film 20; and a planarization film 21 above the third metal layer.

The above semiconductor layer is formed of, for example, amorphous silicon, low-temperature polycrystalline silicon (LTPS), or semiconductor oxide. A thin-film transistor TR is formed to include the gate electrode GE and the semiconductor film 15.

Note that, in this embodiment, the thin-film transistor TR is of a top-gate type. Alternatively, the thin-film transistor TR may be of a bottom-gate type.

The display region DA includes light-emitting elements X and their control circuits for the respective subpixels SP. The thin-film transistor layer 4 includes the control circuits and lines connecting to the control circuits. Examples of the lines connecting to the control circuits include: a scan signal line GL and a light-emission control line EM formed in the first metal layer; an initialization power supply line IL formed in the second metal layer; and a data signal line DL and a high-voltage power supply line PL formed in the third metal layer. Each of the control circuits includes: a drive transistor to control a current of a light-emitting element X; a write transistor electrically connecting to a scan signal line; and a light-emission control transistor electrically connecting to a light-emission control line (not shown).

Each of the first metal layer, the second metal layer, and the third metal layer is made of, for example, a metal monolayer film containing at least one of, for example, aluminum, tungsten, molybdenum, tantalum, chromium, titanium, or copper. Alternatively, each of the layers is made of a multilayer film containing these metals.

Each of the inorganic insulating films 16, 18, and 20 can be made of, for example, a silicon oxide ($SiO_x$) film or a silicon nitride ($SiN_x$) film formed by the CVD. Alternatively, each of the films can be made of a multilayer film containing these films. The planarization film 21 can be made of an applicable organic material such as, for example, polyimide or acrylic resin.

The light-emitting-element layer 5 includes: a first electrode (an anode) 22 above the planarization film 21; an insulative edge cover film 23 to cover an edge of the first electrode 22; a functional layer 24 above the edge cover film 23; and a second electrode (a cathode) 25 above the functional layer 24. That is, the light-emitting-element layer 5 includes the plurality of light-emitting elements X each including: the first electrode 22; a light-emitting layer included in the functional layer 24; and the second electrode 25. The light-emitting elements X emit light in different colors. The light-emitting layer will be described later. The edge cover film 23 is made of such an organic material as polyimide or acrylic resin. The organic material is applied and patterned by photolithography to form the edge cover film 23. Moreover, this edge cover film 23 overlaps with end portions of surfaces of the first electrodes 22 each shaped into an island, and defines pixels (the subpixels SP). The edge cover film 23 forms banks each corresponding to one of the plurality of light-emitting elements X and separating the plurality of pixels (the subpixels SP) from one another. Moreover, the functional layer 24 is an electroluminescence (EL) layer including an EL element. Note that the edge cover film 23 forms a bank shaped into a frame in plan view. In the display device 2, the edge cover film 23 is provided on the thin-film-transistor layer 4 to separate the light-emitting elements X (the subpixels SP) from one another.

In the light-emitting-element layer 5, the light-emitting elements X include light-emitting elements Xr, Xg, and Xg that emit light in different colors. The light-emitting element Xr (red) is a first light-emitting element. The light-emitting element Xg (green) is a second light-emitting element. The light-emitting element Xb (blue) is a third light-emitting element. Moreover, each of the light-emitting elements X includes: the first electrode 22; the functional layer 24 (including the light-emitting layer); and the second electrode 25. The first electrode 22 is an electrode shaped into an island and provided for each light-emitting element X (i.e., provided for each subpixel SP). The second electrode 25 is, as will be described in detail, shaped into a strip, and provided for each of the light-emitting elements Xr, Xg, and Xb in respective colors. Moreover, the light-emitting element Xr (red), the light-emitting element Xg (green), and the light-emitting element Xb (blue) are respectively included in the subpixel SPr, the subpixel SPg, and the subpixel SPb.

As to any of the light-emitting elements Xr, Xg, and Xb, the light-emitting layer to be described later may be, for example, either an organic light-emitting layer; that is, an organic light-emitting diode (OLED), or a quantum-dot light-emitting layer; that is, a quantum-dot light-emitting diode (QLED).

The functional layer 24 includes, for example: a hole-injection layer 24*a*; a hole-transport layer 24*b*; a light-emitting layer 24*c*; and an electron-transport layer 24*d*, all of which are stacked on top of another in the stated order from below. Moreover, the functional layer 24 may be provided with an electron-injection layer, an electron-blocking layer, or a hole-blocking layer. The light-emitting layer 24*c* is formed of droplets applied by spin coating or inkjet printing. The applied droplets are patterned in the shape of an island to form the light-emitting layer 24*c*. The other layers are shaped into islands or monolithic forms (common layers). Moreover, the functional layer 24 can omit one or more of the hole-injection layer 24*a*, the hole-transport layer 24*b*, and the electron-transport layer 24*d*. Furthermore, in the functional layer 24 of this embodiment, the hole-transport layer 24*b* is a first charge-transport layer provided between the first electrode 22 and the light-emitting layer 24*c*, and the electron-transport layer 24*d* is a second charge-transport layer provided between the second electrode 25 and the light-emitting layer 24*c*. In addition, in the functional layer 24 of this embodiment, the electron-transport layer 24*d* is made of a material exhibiting electron-transporting capability and piezoelectricity. The electron-transport layer 24*d* also acts as a stress applying unit to apply stress to the functional layer 24 in response to application of a voltage from a third electrode and a fourth electrode to be described later. The stress applying unit will be described later in detail. Note that materials forming the layers included in the functional layer 24 will be described later.

The display device 2 of this embodiment, as exemplified in FIG. 2, includes: the anodes (the first electrodes 22); the functional layers 24; and the cathodes (the second electrodes 25) in the stated order from toward the thin-film transistor layer 4. That is, the display device 2 has a so-called known structure.

Moreover, in the display device 2 of this embodiment illustrated in FIG. 4, the light-emitting elements Xr, Xg, and Xb are separated from each other by the edge cover film 23 acting as the bank. Each of the light-emitting elements X includes: the first electrode 22 shaped into an island; the hole-injection layer 24*a* shaped into an island; the hole-transport layer 24*b* shaped into an island; and one of the light-emitting layers 24*cr*, 24*cg*, or 24*cb* (collectively referred to as a light-emitting layer 24*c*) each shaped into an island. Furthermore, each of the light-emitting elements X is provided with: the electron-transport layer 24*d* shaped into a monolithic form in common among all the subpixels SP;

and the second electrode 25 shaped into a strip. Note that, as exemplified in FIG. 5, the second electrodes 25 are not limited to have a uniform width. For example, the second electrodes 25 may have the width regularly varying in an extending direction of the second electrodes 25.

Moreover, as exemplified in FIG. 4, the display device 2 of this embodiment includes an insulating film ZF provided on the electron-transport layer 24*d* to cover the second electrode 25. This insulating film ZF can be made of an insulating material transparent to light. The insulating film ZF is, for example, a silicon oxide ($SiO_x$) film, a silicon nitride ($SiN_x$) film, or a silicon oxide nitride (SiON) film formed by sputtering. Alternatively, the insulating film ZF can be made of a multilayer film of these films. Furthermore, on this insulating film ZF, a third electrode TE and a fourth electrode FE are provided to sandwich the second electrode 25. In addition, this insulating film ZF includes an integrated combination of: a first insulating film provided between the functional layer 24 and the third electrode TE; and a second insulating film provided between the functional layer 24 and the fourth electrode FE. That is, in this embodiment, the insulating film ZF is provided to the electron-transport layer 24*d*. Hence, carriers (electrons and holes) from the third electrode and the fourth electrode are not supplied to the electron-transport layer 24*d*. Note that, for the sake of simplicity, FIG. 4 shows only the second electrode 25, the third electrode TE, and the fourth electrode FE provided to the light-emitting element Xg. FIG. 4 omits illustrations of the second electrode 25, the third electrode TE, and the fourth electrode FE provided to each of the light-emitting elements Xr and Xb.

Moreover, other than the above description, the insulating film ZF may be replaced with: the first insulating film provided between the electron-transport layer (the second charge-transport layer) 24*d* and the third electrode TE; and the second insulating film formed separately from the first insulating film, and provided between the electron-transport layer 24*d* and the fourth electrode FE. Note that, as described above, it is preferable to provide the insulating film ZF including an integrated combination of the first insulating film and the second insulating film, because such a configuration can simplify production steps of the display device 2.

Moreover, in the display device 2 of this embodiment as exemplified in FIG. 5, the third electrodes TE, the second electrodes 25, and the fourth electrodes FE are shaped into strips and arranged on the light-emitting elements Xr in red, the light-emitting elements Xg in green, and the light-emitting elements Xb in blue. A third electrode TE, a second electrode 25, and a fourth electrode FE are provided on two each of the light-emitting elements Xr, Xg, and Xb arranged in line. Moreover, as illustrated in FIG. 5, the plurality of third electrodes TE have respective ends connected to one end of a power supply 61. Furthermore, the plurality of third electrodes TE have respective other ends connected to each other (not shown). Likewise, as illustrated in FIG. 5, the plurality of fourth electrodes FE have respective ends connected to another end of the power supply 61. In addition, the plurality of fourth electrodes FE have respective other ends connected to each other (not shown). Moreover, the plurality of second electrodes 25 have respective opposing ends connected to each other. The second electrodes 25 are connected to a not-shown low power-supply voltage electrode (ELVSS).

Moreover, the display device 2 of this embodiment is provided with, as illustrated in FIG. 5, a control apparatus 80 that controls driving of the power supply 61. This control apparatus 80 detects a condition (an operating condition) of the functional layer 24 (i.e., to what extent the deterioration of the functional layer 24 has advanced over time), and, using a result of the detection, controls application of a voltage from the power supply 61 to the third electrode TE and the fourth electrode FE. That is, the control apparatus 80 causes the power supply 61 to apply the voltage to the third electrode TE and the fourth electrode FE, to compensate for the deterioration of the functional layer 24 over time. As a result, the display device 2 of this embodiment can reduce a decrease in output of light even though the functional layer 24 deteriorates over time (as will be described in detail).

Moreover, the control apparatus 80 includes, as illustrated in FIG. 5, a timer 81*a* acting as a detecting unit to detect a condition of the functional layer 24, a storage unit 82 to store predetermined threshold value information, and a control unit 83 to control the power supply 61 in accordance with a result of the detection obtained from the timer 81*a* and the threshold value information stored in the storage unit 82. Then, the display device 2 of this embodiment changes a value of the voltage to be applied from the power supply 61 to the third electrode TE and the fourth electrode FE, in accordance with the deterioration of the functional layer 24 over time.

The timer 81*a* measures an operating time period (i.e., a sum of time periods in which the voltage is applied to the first electrode 22 and the second electrode 25) of the display device 2 (the functional layer 24). Then, as the result of the detection, the timer 81*a* outputs a result of the measurement to the control unit 83.

The storage unit 82 is, for example, a non-volatile memory. This storage unit 82 previously stores threshold value information with respect to the result of the detection, when, for example, the display device 2 is shipped from the factory. Moreover, this threshold value information indicates, in response to the result of the detection, a voltage indication value of the voltage to be applied from the predetermined power supply 61 to the third electrode TE and the fourth electrode FE. Specifically, for example, if the timer 81*a* shows the result of the measurement (the result of the detection) of up to a time period X1, the threshold value information indicates that the voltage indication value is set to "0 V" (i.e., the power supply 61 does not apply a voltage to either the third electrode TE or the fourth electrode FE). If the result of the measurement (the result of the detection) exceeds the time period X1 up to a time period X2, the threshold value information indicates that the voltage indication value is set to "A1 V". If the result of the measurement (the result of the detection) exceeds a time period Xn up to a time period Xn+1, the threshold value information indicates that the voltage indication value is set to "An V" (n is an integer of 2 or greater). Moreover, the voltage indication value is set larger as the value of the result of the measurement becomes larger. (That is, the relationship "A1 V<"An V" holds.)

The control unit 83 is, for example, a CPU or an MPU. When a result of detection is input from the timer 81*a*, the control unit 83 obtains, with reference to the threshold value information stored in the storage unit 82, a voltage indication value based on the input result of the detection. Then, in accordance with the obtained voltage indication value, the control unit 83 causes the power supply 61 to apply a voltage, based on the voltage indication value, to the third electrode TE and the fourth electrode FE.

Furthermore, similar to the insulating film ZF and the second electrodes 25, the third electrodes TE and the fourth electrodes FE are made of light-transparent materials. Specifically, each of the third electrodes TE and the fourth electrodes FE is a transparent electrode made of a light-transparent conductive material such as, for example, a thin film of Ag, Au, Pt, Ni, Ir, or Al, a thin film of an MgAg alloy, indium tin oxide (ITO), or indium zinc oxide (IZO). The third electrode TE and the fourth electrode FE are formed on the insulating film ZF by such a technique as, for example, sputtering or the CVD. As can be seen, in the display device 2 of this embodiment, the second electrode 25, the third electrode TE, the fourth electrode FE and the insulating film ZF are made of a light-transparent material. Such a feature can reduce a decrease in substantial light-emission area of the light-emitting layer 24*c* included in the light-emitting element X provided below, and stop blocking light emitted from the light-emitting layer 24*c* such that the light can be emitted outside.

Moreover, the power supply 61 is either a direct current power supply or an alternating current power supply. Furthermore, as to the display device 2 of this embodiment, the stress applying unit (i.e., in this embodiment, the electron-transport layer 24*d*) applies a voltage from the power supply 61 to the third electrode TE and the fourth electrode FE. Hence, the stress is applied to: at least one of the hole-injection layer 24*a*, the hole-transport layer 24*b*, or the light-emitting layer 24*c* included in the functional layer 24, and the electron-transport layer 24*d* (itself).

Specifically, in the display device 2 of this embodiment, in accordance with an instruction from the control unit 83, an alternating current voltage having a voltage value ranging, for example, 2 to 5 V is applied from the power supply 61 to the third electrode TE and the fourth electrode FE. This applied voltage generates an alternating electric field between the third electrode TE and the fourth electrode FE. The alternating electric field acts through the insulating film ZF on the electron-transport layer 24*d* functioning as the stress applying unit. As a result, in the electron-transport layer 24*d*, the alternating electric field provided through the insulating film ZF produces a phenomenon of the inverse piezoelectric effect. Hence, the electron-transport layer 24*d* develops a compressive strain and a tensile strain. Then, these compressive strain and tensile strain are developed as stress in the electron-transport layer 24*d* itself, and propagated sequentially as the stress from the electron-transport layer 24*d* toward the light-emitting layer 24*c*. Hence, the other layers in the functional layer 24 also develop the compressive strain and the tensile strain. Thus, in at least one of the electron-transport layer 24*d*, the light-emitting layer 24*c*, the hole-transport layer 24*b*, or the hole-injection layer 24*a*, the bandgap varies, thereby reducing the potential barrier when carriers (electrons and holes) are injected. As a result, even though the functional layer 24 deteriorates over time, this embodiment makes it possible to adjust balance of the carriers in the light-emitting element X (the light-emitting layer 24*c*), thereby contributing to reduction in decrease in light emission efficiency. Moreover, in this embodiment, when the bandgap of the light-emitting layer 24*c* varies, the wavelength of light emitted from the light-emitting element X also varies. As a result, this embodiment makes it possible to increase a color gamut of colors of light emitted from the light-emitting element X.

Moreover, if the power supply 61 is an alternating current power supply, the compressive strain and the tensile strain develops alternately in the electron-transport layer 24*d*, depending on the variation in driving frequency (alternating current frequency) of the alternating current power supply. That is, in accordance with the variation in orientation of the alternating electric field (i.e., a degree of the alternating current frequency) between the third electrode TE and the fourth electrode FE, the compressive strain and the tensile strain alternately develop in the electron-transport layer 24*d*. The compressive strain and the tensile strain are propagated at least to the light-emitting layer 24*c* adjacent to the electron-transport layer 24*d*. Hence, if the power supply 61 is an alternating current power supply, the light-emitting layer 24*c* exhibits periodic variation in bandgap, and accordingly, in wavelength of emitted light. Hence, if the power supply 61 is an alternating current power supply, the alternating current frequency is preferably a high frequency of, for example, 120 Hz or higher so that the user never visually recognizes the periodic variation in the wavelength of the emitted light. In particular, if the high alternating current frequency is higher than, and a multiple of, a frame rate (e.g., 60 Hz), the high alternating current frequency is preferable because the user can never visually recognize the periodic variation in the wavelength of the emitted light.

Moreover, if the power supply 61 is a direct current power supply, either the compressive strain or the tensile strain is developed in the electron-transport layer 24*d* and propagated at least to the light-emitting layer 24*c*. Hence, the wavelength of light emitted from the light-emitting layer 24*c* varies so that the color gamut of the emitted light increases. Furthermore, in this embodiment, regardless of an alternating current power supply or a direct current power supply, an applied voltage is set so that either the compressive strain or the tensile strain, caused by the voltage applied from the power supply 61 to the third electrode TE and the fourth electrode FE, elastically transforms each of the layers including the electron-transport layer 24*d* in the functional layer 24. Hence, the voltage applied to the third electrode TE and the fourth electrode FE does not cause damage to the light-emitting element X.

Returning to FIG. 4, if the organic light-emitting layer (the light-emitting layer 24*c*) of an OLED is formed by vapor deposition, a fine metal mask (FMM) is used. The FMM is a sheet (e.g., invar) including many openings. Organic material passing through one opening forms an organic layer (corresponding to one subpixel SP) shaped into an island. Other than the above description, the organic light-emitting layer (the light-emitting layer 24*c*) of an OLED can be formed of a predetermined solution delivered in a form of droplets.

Moreover, if some or all of the light-emitting elements Xr, Xg, and Xb are OLEDs, holes and electrons recombine together in each light-emitting layer 24*c* by a drive current between the first electrode 22 and the second electrode 25, which forms an exciton. While the exciton transforms to the ground state, light is released. Because the second electrode 25 is highly transparent to light, and the first electrode 22 is reflective to light, the light released from the functional layer 24 travels upwards. This is how the light-emitting-element layer 5 is of a top-emission type.

A QLED quantum-dot light-emitting layer (the light-emitting layer 24*c*) is formed of, for example, a solution made of a solvent and quantum dots dispersed in the solvent. The solution is applied and patterned by photolithography, thereby successfully forming a quantum-dot light-emitting layer (corresponding to one subpixel SP) shaped into an island.

Furthermore, if the light-emitting elements Xr, Xg, and Xb are QLEDs, a drive current between the first electrode 22 and the second electrode 25 injects the holes into a valence band, and the electrons into a conduction band, of the quantum dots in each light-emitting layer 24*c*. Most of the holes and the electrons injected into the quantum dots form an exciton. An essential transformation process involves recombination of the electrons and the holes in the exciton state to release light (fluorescence).

The light-emitting-element layer 5 may be a light-emitting element other than the above OLED and QLED; that is, for example, a light-emitting element including an inorganic light-emitting diode.

Moreover, the description below shows, as an example, a case where the light-emitting layer 24*c* is formed of a quantum-dot light-emitting layer containing quantum dots. That is, in the display device 2 of this embodiment, the light-emitting element Xr in red includes a red quantum-dot light-emitting layer emitting a red light, the light-emitting element Xg in green includes a green quantum-dot light-emitting layer emitting a green light, and the light-emitting element Xb in blue includes a blue quantum-dot light-emitting layer emitting a blue light.

The quantum-dot light-emitting layer (the light-emitting layer 24*c*) contains quantum dots acting as a functional material contributing to a function of the light-emitting layer 24*c*. As to the light-emitting layers 24*cr*, 24*cg*, and 24*cb* in respective colors, the quantum dots are different at least in size in accordance with the respective emission spectra.

The first electrode (an anode) 22, which reflects light, is a multilayer formed of, for example, indium tin oxide (ITO), indium zinc oxide (IZO), and one of silver (Ag), Al, or an alloy containing Ag and Al. The second electrode (a cathode) 25 is a transparent electrode formed of a light-transparent conductive material such as, for example, a thin film of Ag, Au, Pt, Ni, Ir, or Al, a thin film of an MgAg alloy, indium tin oxide (ITO), or indium zinc oxide (IZO). Note that, other than the above description, the second electrode 25 may be formed of, for example, nanowires made of such a metal as silver. If the second electrode 25 is formed of such metal nanowires, a solution containing the metal nanowires is applied to form the second electrode 25. As a result, in the light-emitting-element layer 5 of the display device 2, other than the first electrode 22, each of the layers in the functional layer 24 and the second electrode 25 can be formed of a predetermined solution delivered in a form of droplets. Hence, the display device 2 can be readily produced.

The sealing layer 6, which is transparent to light, includes: an inorganic sealing film 26 formed directly on the second electrode 25 (formed in contact with the second electrode 25); an organic film 27 above the inorganic sealing film 26; and an inorganic sealing film 28 above the organic film 27. The sealing layer 6 covering the light-emitting-element layer 5 keeps the light-emitting-element layer 5 from such foreign substances as water and oxygen.

The organic film 27 is transparent to light, and has a planarization effect. An applicable organic material is applied by, for example, inkjet printing to form the organic film 27. The inorganic sealing films 26 and 28 are inorganic insulating films. Each of the inorganic sealing films 26 and 28 can be, for example, a silicon oxide film, a silicon nitride film, or a silicon oxide nitride film formed by the CVD. Alternatively, each of the inorganic sealing films 26 and 28 can be a multilayer film of these films.

The functional film 39 has at least one of, for example, an adaptive optics correction function, a touch sensor function, and a protection function.

Figure 6:
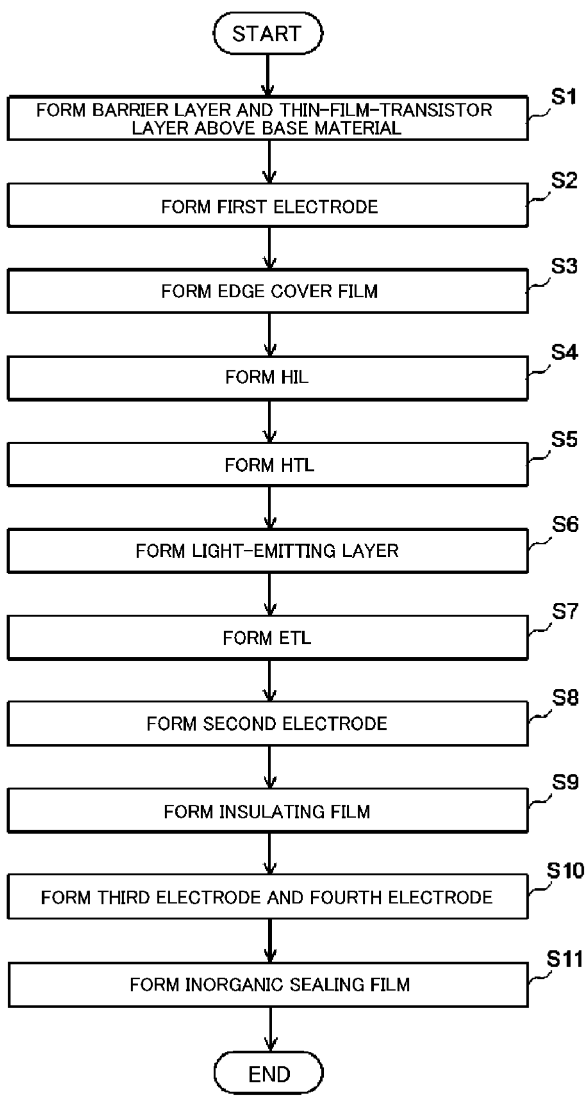
FIG. 6 is a flowchart showing a method for producing the display device.

Next, also with reference to FIG. 6, a method for producing the display device 2 of this embodiment is specifically described. FIG. 6 is a flowchart showing the method for producing the display device.

As shown in FIG. 6, in the method for producing the display device 2 of this embodiment, first, the barrier layer 3 and the thin-film-transistor layer 4 are formed above the base material 12 (Step S1). Next, using, for example, sputtering and photolithography, the first electrode (an anode) 22 is formed on the planarization film 21 (Step S2). Then, the edge cover film 23 is formed (Step S3).

Next, by a droplet delivery technique such as inkjet printing, the hole-injection layer (the HIL) 24*a* is formed (Step S4). Specifically, at this hole-injection-layer forming step, examples of a solvent contained in a hole-injection-layer forming solution include: 2-propanol; butyl benzoate; toluene; chlorobenzene; tetrahydrofuran; and 1,4-dioxane. Moreover, a solute contained in the hole-injection-layer forming solution; that is, a hole-injecting material (a functional material) is, for example, either: a polythiophene-based conductive material such as PEDOT:PSS; or an inorganic compound such as nickel oxide or tungsten oxide. Then, at this HIL forming step, the above hole-injection-layer forming solution delivered in a form of droplets on the first electrode 22 is baked at a predetermined temperature to form the hole-injection layer 24*a* having a thickness of, for example, 20 to 50 nm.

Note that if some or all of the light-emitting elements Xr, Xg, and Xb are OLEDs, in addition to the above materials, examples of the hole-injecting material (a functional material) of the hole-injection-layer forming solution include: benzine, styrylamine, triphenylamine, porphyrin, triazole, imidazole, oxadiazole, polyallylalkane, phenylenediamine, allylamine, oxazole, anthracene, fluorenone, hydrazone, stilbene, triphenylene, or azatriphenylene; a derivative of these substances; and a chain-conjugated organic polymer such as a polysilane-based compound, a vinylcarbazole-based compound, a thiophene-based compound, or an aniline-based compound. Moreover, the solvent of the hole-injection-layer forming solution for the OLEDs can be the same as that for the above QLEDs.

Then, by a droplet delivery technique such as inkjet printing, the hole-transport layer (the HTL) 24*b* is formed (Step S5). Specifically, at this hole-transport-layer forming step, examples of a solvent contained in a hole-transport-layer forming solution include: chlorobenzene; toluene; tetrahydrofuran; and 1,4-dioxane. Moreover, a solute contained in the hole-transport-layer forming solution; that is, a hole-transporting material (a functional material) is, for example, either: an organic polymer such as TFB, PVK, or poly-TPD; or an inorganic compound such as nickel oxide. Then, at this HTL forming step, the above hole-transportation-layer forming solution delivered in a form of droplets on the hole-injection layer 24*a* is baked at a predetermined temperature to form the hole-transport layer 24*b* having a thickness of, for example, 20 to 50 nm.

Note that if some or all of the light-emitting elements Xr, Xg, and Xb are OLEDs, in addition to the above materials, examples of the hole-transporting material (a functional material) of the hole-transport-layer forming solution include: benzine, styrylamine, triphenylamine, porphyrin, triazole, imidazole, oxadiazole, polyallylalkane, phenylenediamine, allylamine, oxazole, anthracene, fluorenone, hydrazone, stilbene, triphenylene, or azatriphenylene; a derivative of these substances; and a chain-conjugated organic polymer such as a polysilane-based compound, a vinylcarbazole-based compound, a thiophene-based compound, or an aniline-based compound. Moreover, the solvent of the hole-transport-layer forming solution for the OLEDs can be the same as that for the above QLEDs.

Next, by a droplet delivery technique such as inkjet printing, the light-emitting layer (the EML) 24*c* is formed (Step S6). Specifically, at this light-emitting-layer forming step, examples of a solvent contained in a light-emitting-layer forming solution include: toluene; and propyleneglycol monomethylether acetate (PGMEA). Moreover, a solute; that is, a light-emitting material (a functional material) is, for example, quantum dots containing C, Si, Ge, Sn, P, Se, Te, Cd, Zn, Mg, S, In, or O.

Note that if some or all of the light-emitting elements Xr, Xg, and Xb are OLEDs, examples of the light-emitting material (a functional material) of the light-emitting-layer forming solution include: anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, or stilbene; a derivative of these substances; and an organic light-emitting material such as a tris(dibenzoylmethyl)phenanthrolineeuropium complex, or ditolylvinylbiphenyl. Moreover, the solvent of the light-emitting-layer forming solution for the OLEDs can be the same as that for the above QLEDs.

Next, by a droplet delivery technique such as inkjet printing or spin coating, the electron-transport layer (the ETL) 24*d* is formed (Step S7). Specifically, at this electron-transport-layer forming step, examples of a solvent contained in an electron-transport-layer forming solution include: 2-propanol; ethanol; toluene; chlorobenzene; tetrahydrofuran; and 1,4-dioxane. Moreover, a solute; that is, an electron-transporting material (a functional material) is, for example: nanoparticles of zinc oxide (ZnO), magnesium oxide (MgO), or magnesium-added zinc oxide (MgZnO) that is a mixed crystal of ZnO and MgO; a nitride semiconductor of gallium nitride (GaN), indium nitride (InN), aluminum nitride (AlN), or a mixed crystal of GaN, InN, and AlN; lead zirconate titanate (PZT); or barium titanate ($BaTiO_3$). Furthermore, the above solutes (the electron-transporting materials) such as nanoparticles of zinc oxide (ZnO) and magnesium-added zinc oxide (MgZnO) have piezoelectricity, as described above.

Note that if some or all of the light-emitting elements Xr, Xg, and Xb are OLEDs, examples of the electron-transporting material (a functional material) of the electron-transport-layer forming solution include, in addition to the above nanoparticles of zinc oxide (ZnO) or magnesium-added zinc oxide (MgZnO): quinoline; perylene; phenanthroline; bisstyryl; pyrazine; triazole; oxazole; oxadiazole; fluorenone; a derivative of these substances; and a metal complex of these substances. More specifically, the examples include: 3,3'-bis(9H-carbazol-9-yl)biphenyl (mCBP); 1,3,5-tris(N-phenylbenzimidazol-2-yl)benzene (TPBI); 3-phenyl-4(1'-naphthyl)-5-phenyl-1,2,4-triazole (TAZ); 1,10-phenanthroline; and alq(tris(8-hydroxyquinoline)aluminum). Moreover, the solvent of the electron-transport-layer forming solution for the OLEDs can be the same as that for the above QLEDs.

Then, on the electron-transport layer 24*d*, a thin metal film is formed as the second electrode (the cathode) 25 (Step S8). The second electrode 25 is made of such a metal as aluminum or silver and formed by, for example, vapor deposition or sputtering.

Next, to cover the electron-transport layer 24*d* and the second electrode 25, the insulating film ZF is formed by, for example, sputtering (Step S9). The insulating film ZF is a silicon oxide ($SiO_x$) film, a silicon nitride ($SiN_x$) film, a silicon oxide nitride (SiON) film, or a multilayer film of these films.

Then, to sandwich the second electrode 25 on the insulating film ZF, the third electrode TE and the fourth electrode FE are formed by, for example, sputtering or the CVD (Step S10). Each of the third electrode TE and the fourth electrode FE is made of a light-transparent conductive material such as, for example: a thin film of Ag, Au, Pt, Ni, Ir, or Al; a thin film of an MgAg alloy; indium tin oxide (ITO); or indium zinc oxide (IZO).

After that, to cover the third electrode TE, the fourth electrode FE, and the insulating film ZF, the inorganic sealing film 26 is formed. After that, on the inorganic sealing film 26, a material (a precursor) of the organic film 27 is applied by inkjet printing and cured to form the organic film 27. Moreover, above the organic film 27, the inorganic sealing film 28 is formed (Step S11). As a result, as illustrated in FIG. 2, the display device 2 is produced to include the light-emitting elements Xr, Xg, and Xb of RGB.

As described above, the display device 2 can be produced.

Figure 7:
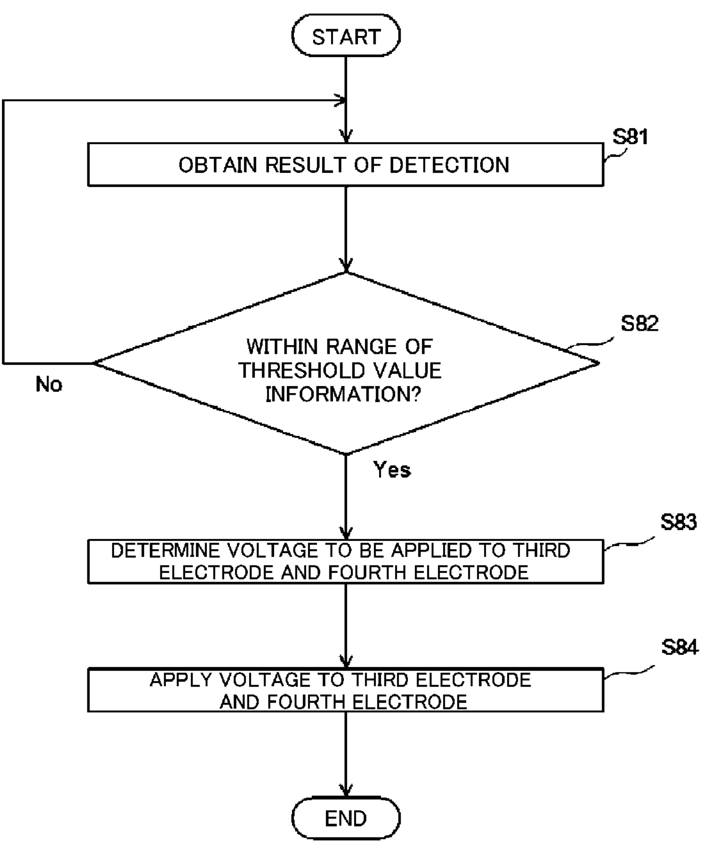
FIG. 7 is a flowchart showing a compensation method performed on the display device.

Next, also with reference to FIG. 7, operation of the display device 2 of this embodiment is specifically described. FIG. 7 is a flowchart showing a compensation method performed on the display device. Note that mainly described below is compensation operation of the control apparatus 80.

As Step S81 in FIG. 7 shows, in the control apparatus 80 of this embodiment, the control unit 83 obtains a result of detection from the timer (the detecting unit) 81*a*, in accordance with a predetermined sampling period.

Next, as Step S82 in FIG. 7 shows, the control apparatus 83 determines, with reference to the threshold value information stored in the storage unit 82, whether the obtained result of the detection is a value within a range of the threshold value information. Then, if the control unit 83 determines that the obtained result of the detection is a value out of the range of the threshold value information, ("NO" at Step S82), the compensation operation returns to Step S81.

Meanwhile, if the obtained result of the detection is a value within the range of the threshold value information ("YES" at Step S82), the control unit 83: obtains from the storage unit 82 a voltage indication value, of a voltage to be applied, corresponding to the result of the detection; and determines the obtained voltage indication value as the voltage to be applied to the third electrode TE and the fourth electrode FE (Step S83).

Then, as Step S84 in FIG. 7 shows, the control unit 83 causes the power supply 61 to apply the voltage, at the determined value of the voltage to be applied to the third electrode TE and the fourth electrode FE.

In accordance with the above steps, the display device 2 of this embodiment performs compensation processing against deterioration of the functional layer 24 over time. The compensation processing can reduce a decrease in light emission efficiency caused by the deterioration over time, and the resulting decrease in output of light.

The light-emitting elements X of this embodiment as described above each include the electron-transport layer (the stress applying unit) 24*d* made of a piezoelectric material. Moreover, this electron-transport layer 24*d* applies stress to the functional layer 24, in response to application of a voltage from the third electrode TE and the fourth electrode FE to the functional layer 24 through the insulating film (the first insulating film and the second insulating film) ZF. Moreover, as to the light-emitting element X of this embodiment, the timer (the detecting unit) 81*a* detects a condition of the functional layer 24. In accordance with a result of the detection by the timer 81*a* and the threshold value information stored in the storage unit 82, the control unit 83 controls a voltage to be applied from the power supply 61 to the third electrode TE and the fourth electrode FE. Hence, the light-emitting element X of this embodiment can reduce a decrease in output of light even though the functional layer 24 deteriorates over time. As a result, this embodiment can provide the light-emitting elements X that emit light of high quality, even though the functional layer 24 deteriorates over time.

Moreover, the display device 2 of this embodiment is provided with the light-emitting elements X including the light-emitting element Xr (red) as the first light-emitting element; the light-emitting element Xg (green) as the second light-emitting element; and the light-emitting element Xb (blue) as the third light-emitting element. The light-emitting elements Xr, Xg, and Xg emit light in different colors. Hence, this embodiment can provide the display device 2 that emits light of high quality, even though the functional layer 24 deteriorates over time. Furthermore, this embodiment provides the above first to third light-emitting elements. Such a feature can readily allow the display device 2 to display a colored image of high quality.

Figure 8:
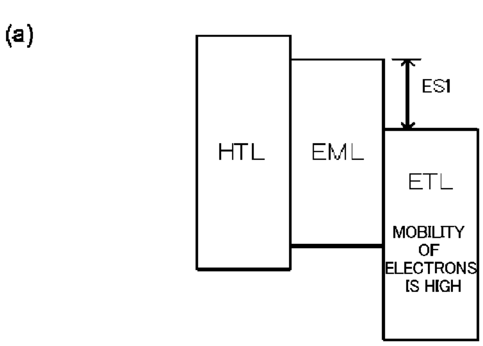
FIG. 8 specifically shows an example of advantageous effects observed in the light-emitting element.
Figure 8:
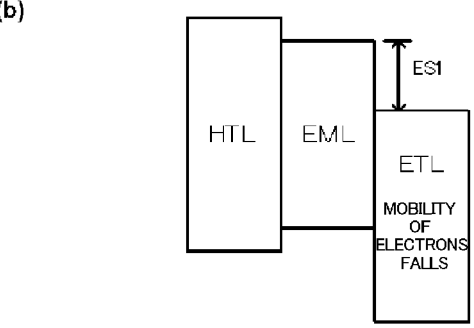
Figure 8:
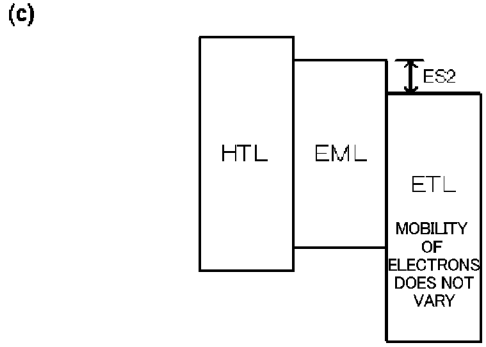
Figure 9:
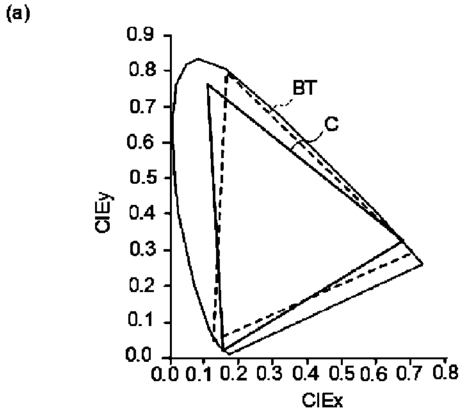
FIG. 9 specifically illustrates advantageous effects of the light-emitting element.
Figure 9:
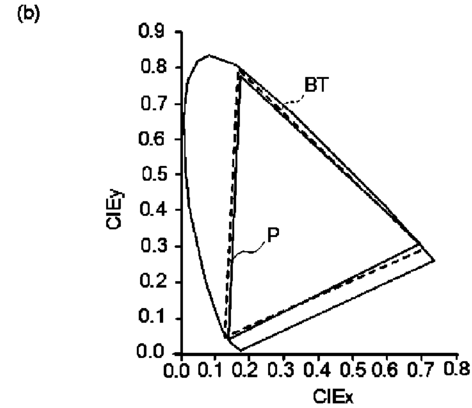

Here, with reference to FIGS. 8 and 9, advantageous effects of a light-emitting element X and the display device 2 of this embodiment are specifically described.

Here, with reference to FIG. 8, specifically described are advantageous effects of reducing a decrease in light emission efficiency of the light-emitting element X and the display device 2 of this embodiment. FIG. 8 specifically shows an example of the advantageous effects observed in the light-emitting element. FIG. 8(*a*) shows an example of an energy level in the light-emitting element before deterioration over time occurs. FIG. 8(*b*) shows an example of an energy level in the light-emitting element after deterioration over time occurs. FIG. 8(*c*) shows an example of an energy level after compensation is performed. Note that in the description below, for example, the bandgap is varied only of the electron-transport layer (the ETL) to reduce a decrease in light emission efficiency.

As FIG. 8(*a*) shows, suppose a case where the functional layer 24 exhibits no deterioration over time. In a light-emitting element including a hole-transport layer HTL, a light-emitting layer EML, and an electron-transport layer ETL, a potential barrier ES1 is found between the light-emitting layer EML and the electron-transport layer ETL. The potential barrier ES1 acts as a barrier to the supply of electrons from the electron-transport layer ETL to the light-emitting layer EML. Moreover, in the case where no deterioration over time occurs to the functional layer 24, as illustrated in FIG. 8(*a*), the mobility of the electrons inside the electron-transport layer ETL is maintained high in numerical value. When a voltage is applied to an anode and a cathode that are not shown, the electrons readily move from the electron-transport layer ETL to the light-emitting layer EML, and the light-emitting layer EML is smoothly supplied with the electrons.

Next, when the light-emitting element is energized and driven, the functional layer 24 deteriorates over time, depending on the driving time period (the energizing time period). As can be seen, as the functional layer 24 deteriorates over time, as shown in FIG. 8(*b*), there is a fall in the value of the mobility of the electrons inside the electron-transport layer ETL, depending on to what extent the deterioration has advanced over time. As a result, as shown in FIG. 8(*b*), no variation in value of the potential barrier ES1 is observed between the light-emitting layer EML and the electron-transport layer ETL. However, the fall is observed in the value of the mobility of the electrons inside the electron-transport layer ETL. Accordingly, there is a fall in the amount of the electrons to be supplied from the electron-transport layer ETL to the light-emitting layer EML. That is, a decrease in efficiency is observed in injection of the carriers (the electrons) from the electron-transport layer ETL to the light-emitting layer EML, and the carriers in the light-emitting layer EML are out of balance. Accordingly, the light emission efficiency of the light-emitting layer EML also decreases.

In contrast, in this embodiment, the control apparatus 80 performs the above compensation operation to apply a voltage to the third electrode TE and the fourth electrode FE, depending on to what extent the deterioration of the functional layer 24 has advanced over time. As a result, FIG. 8(*c*) shows that, in the light-emitting element, the value of the mobility of the electrons inside the electron-transport layer ETL does not vary before and after the application of a voltage to the third electrode TE and the fourth electrode FE. However, as to the bandgap of the electron-transport layer ETL, the compressive strain and the tensile strain described above are developed in the electron-transport layer ETL when the voltage is applied as described above. Hence, in the electron-transport layer ETL, as FIG. 8(*c*) shows an example, the bandgap varies to increase. As a result, as shown in FIG. 8(*c*), the value of the potential barrier between the light-emitting layer EML and the electron-transport layer ETL decreases to a potential barrier ES2. As can be seen, the compensation operation decreases the potential barrier. Hence, even if there is no variation in the value of the mobility of the electrons in the electron-transport layer ETL, the amount of the electrons to be supplied from the electron-transport layer ETL to the light-emitting layer EML can be brought back to the value observed before the deterioration over time occurs. As a result, as to a product according to this embodiment, even though the functional layer 24 has deteriorated over time, the balance of the carriers in the light-emitting layer EML can be adjusted, depending on to what extent the deterioration has advanced over time. Such a feature can reduce a decrease in light emission efficiency, and the resulting decrease in output of light.

Note that, for the sake of simplicity, the above description exemplifies a case where the bandgap is varied only of the electron-transport layer ETL. However, this embodiment shall not be limited to such a case. This embodiment may achieve the above advantageous effects by any given manner as long as the bandgap is varied for at least one of the layers included in the functional layer 24, depending on to what extent the deterioration has advanced over time.

Next, with reference to FIG. 9, other advantageous effects of the light-emitting element X and the display device 2 of this embodiment are specifically described. FIG. 9 specifically illustrates advantageous effects of the light-emitting element. FIG. 9(*a*) is a diagram showing an example of a simulation result of a color gamut of light emitted from a comparative product. FIG. 9(*b*) is a diagram showing an example of a simulation result of a color gamut of light emitted from a product according to this embodiment.

The inventors of the disclosure assumed a comparative product and a product according to this embodiment. The product according to this embodiment is the comparative product provided with the insulating film ZF, the third electrode TE, and the fourth FE. Then, the inventors obtained a simulation result of a color gamut of light emitted from (presented by) the comparative product. Moreover, as to the product according to this embodiment, the inventors obtained a simulation result of a color gamut of emitted light when, for example, a power with an alternating-current voltage having an effective value of 2 V and an alternating current having a driving frequency of 480 Hz is applied to the third electrode TE and the fourth electrode FE.

FIG. 9(*a*) shows that, in the CIE 1931 color space (color system), the comparative product emitted light in a color gamut represented by a solid line C. Specifically, the red light had a peak wavelength of 620 nm at a half width of 30 nm. The value of CIEx was 0.676154, and the value of CIEy was 0.323636. Moreover, the green light had a peak wavelength of 520 nm at a half width of 30 nm. The value of CIEx was 0.110367, and the value of CIEy was 0.766884. Furthermore, the blue light had a peak wavelength of 450 nm at a half width of 30 nm. The value of CIEx was 0.153488, and the value of CIEy was 0.022261. In addition, this comparative product covered 86.5% of the BT.2020 color space represented by a dotted line BT in FIG. 9(*a*).

Whereas, FIG. 9(*b*) shows that, in the CIE 1931 color space (color system), the product according to this embodiment emitted light in a color gamut represented by a solid line P. Specifically, the red light had a peak wavelength of 630 nm at a half width of 30 nm. The value of CIEx was 0.695649, and the value of CIEy was 0.30423. Moreover, the green light had a peak wavelength of 530 nm at a half width of 30 nm. The value of CIEx was 0.1762, and the value of CIEy was 0.7895. Furthermore, the blue light had a peak wavelength of 460 nm at a half width of 30 nm. The value of CIEx was 0.142511, and the value of CIEy was 0.037339. In addition, this comparative product covered 92.7% of the BT.2020 color space represented by the dotted line BT in FIG. 9(*b*).

As can be seen, the verification test conducted by the inventors of the disclosure shows that the coverage percentage to the BT.2020 color space increases by 6.2 (=92.7−86.5) %. The product according to this embodiment proves an increase in the color gamut of the colors of light, compared with the comparative product.

Moreover, as to the product according to this embodiment, it is confirmed that the stress (the compressive strain and the tensile strain) from the electron-transport layer (the stress applying unit 24*d*) increases the peak wavelengths of the respective red light, the green light, and the blue light by 10 nm. Specifically, as to the red light-emitting layer 24*cg*, it is confirmed that the bandgap (i.e., the difference between the VBM(HOMO) and CBM(LUMO)) varies by 32 meV; that is, a bandgap of 2.000 eV at a peak wavelength of 620 nm varies to a bandgap of 1.968 eV at a peak wavelength of 630 nm. Moreover, as to the green light-emitting layer 24*cg*, it is confirmed that the bandgap varies by 45 meV; that is, a bandgap of 2.384 eV at a peak wavelength of 520 nm varies to a bandgap of 2.339 eV at a peak wavelength of 530 nm. Furthermore, as to the blue light-emitting layer 24*cb*, it is confirmed that the bandgap varies by 60 meV; that is, a bandgap of 2.755 eV at a peak wavelength of 450 nm varies to a bandgap of 2.695 eV at a peak wavelength of 460 nm. As can be seen, the product according to this embodiment shows that the stress causes the variation in the bandgaps of the light-emitting layers 24*cr*, 24*cg*, and 24*cb* in RGB colors. That is, it is confirmed that, even though the functional layer 24 deteriorates over time, the product according to this embodiment appropriately applies a voltage to the third electrode TE and the fourth electrode FE, thereby making it possible to vary the bandgaps of the light-emitting layers 24*cr*, 24*cg*, and 24*cb* in RGB colors and increase the color gamut of the colors of the emitted light. In other words, it is proved that, even though the functional layer 24 deteriorates over time, the product according to this embodiment can recover light emission efficiency and output of light, and improve quality of emitted light.

Moreover, in the display device 2 of this embodiment, the third electrode TE and the fourth electrode FE are provided across the insulating film (the first insulating film and the second insulating film) ZF from the electron-transport layer (the stress applying unit) 24*d*. Hence, even if a voltage is applied to the third electrode TE and the fourth electrode FE, carriers (electrons and holes) are not supplied from either the third electrode TE or the fourth electrode FE to the functional layer 24. As a result, in the display device 2 of this embodiment, the light emission capability of the light-emitting layer 24*c* does not decrease, thereby making it possible to reduce a decrease in the light emission capability of the light-emitting elements X and in the display capability of the display device 2.

Moreover, as to the display device 2 of this embodiment, the functional layer 24 of each light-emitting element X is a multilayer stack including: the light-emitting layer 24*c*; the hole-transport layer (the first charge-transport layer) 24*b* provided between the first electrode 22 and the light-emitting layer 24*c*; and the electron-transport layer (the second charge-transport layer) 24*d* provided between the second electrode 25 and the light-emitting layer 24*c*. When the stress applying unit (the electron-transport layer 24*d*) applies stress to the functional layer 24, such a feature ensures transformation of the light-emitting layer 24*c*, thereby making it possible to appropriately improve quality of light emitted from the light-emitting element X.

Furthermore, as to the display device 2 of this embodiment, the electron-transport layer (the second charge-transport layer) 24*d* is made of a piezoelectric material, and thus also acts as the stress applying unit. Such a feature can reduce the number of components of the display device 2, and readily simplify the structure of the display device 2.

Note that, other than the above description, for example, a material exhibiting hole-transporting capability and piezoelectricity may be used so that the hole-transport layer 24*b* can also act as the stress applying unit. Specifically, the above piezoelectric material may be doped with impurities in order to have a p-type conductivity. An example of such a material includes a nitride semiconductor doped with Mg (e.g., Mg (a dopant)-GaN). In such a case, the light-emitting element X is preferably of an inverted structure, rather than of a known structure. This is because, as can be seen in the above embodiment, the inverted structure allows the third electrode TE and the fourth electrode FE to be arranged readily close to the hole-transport layer 24*b* also acting as the stress applying unit.

Moreover, as to the display device 2 of this embodiment, the third electrode TE and the fourth electrode FE are provided above the electron-transport layer 24*d* to sandwich the second electrode 25 through the insulating film ZF. Such a feature keeps the light-emitting element X and the display device 2 from increasing in size, and allows the electron-transport layer 24*d* to develop stress, thereby making it possible to ensure an improvement in quality of emitted light and of a displayed image.

Second Embodiment

Figure 10:
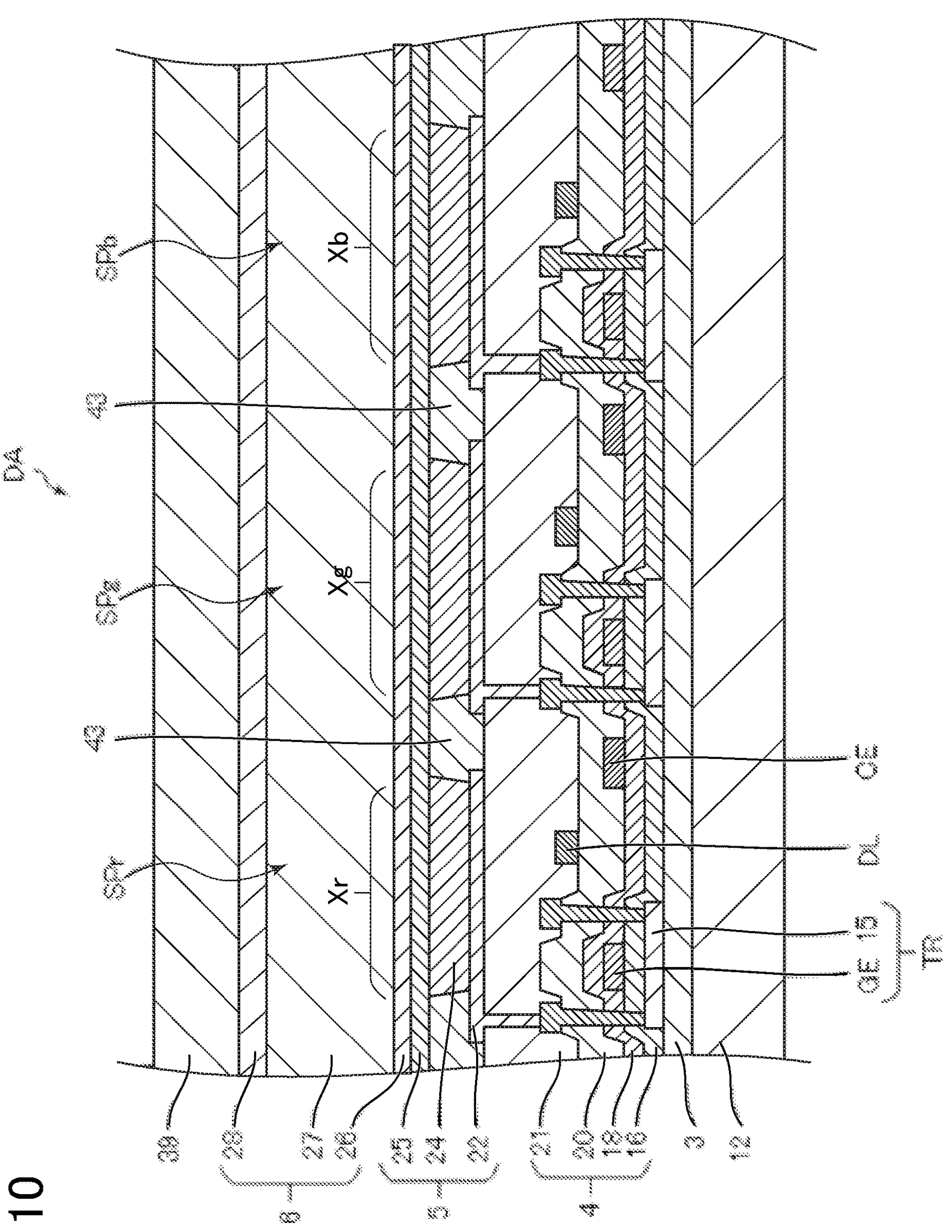
FIG. 10 is a view illustrating an essential configuration of the display device including light-emitting elements according to a second embodiment of the disclosure.
Figure 11:
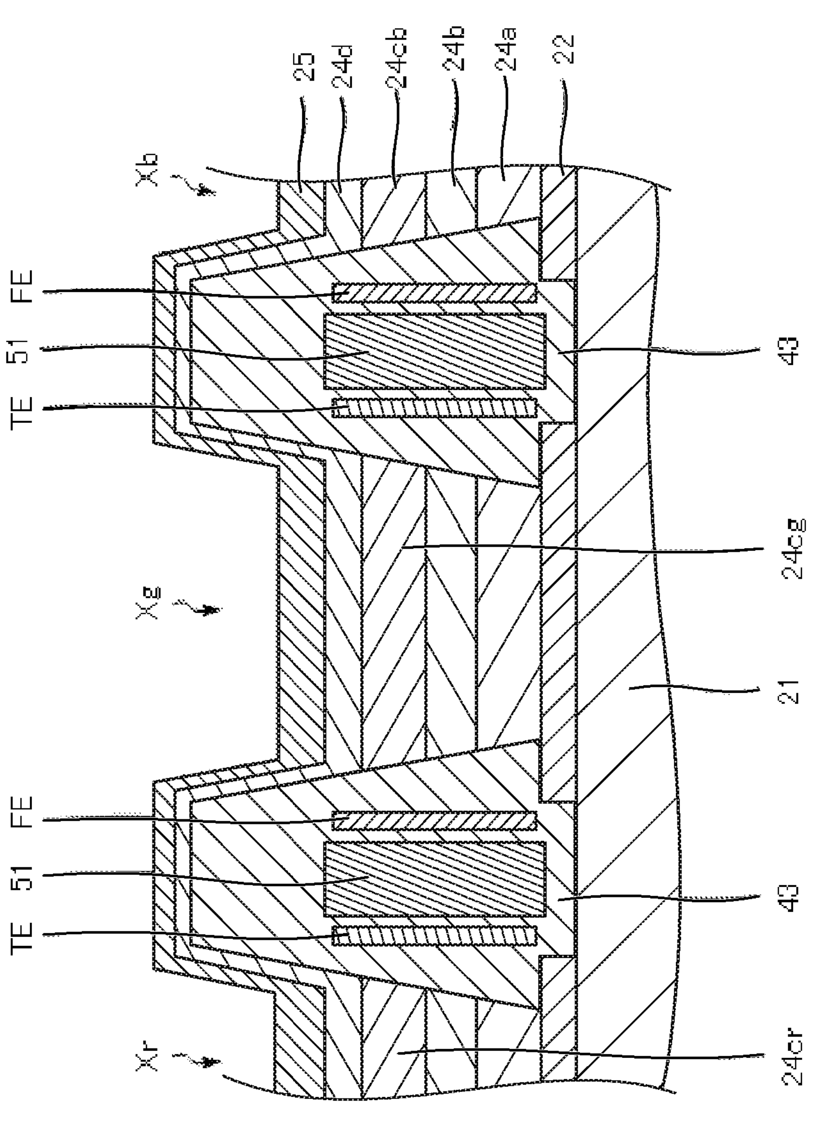
FIG. 11 is a drawing specifically illustrating an exemplary configuration of a light-emitting element in FIG. 10.

FIG. 10 is a view illustrating an essential configuration of the display device including light-emitting elements according to a second embodiment of the disclosure. FIG. 11 is a drawing specifically illustrating an exemplary configuration of a light-emitting element in FIG. 10.

In FIG. 10, a main difference between this embodiment and the first embodiment is that, in this embodiment, an edge cover film acting as a bank includes inside a piezoelectric element unit acting as a stress applying unit, the third electrode TE, and the fourth electrode FE. Note that like reference signs designate identical and corresponding constituent features between this embodiment and the first embodiment. Such features will not be elaborated upon repeatedly.

As exemplified in FIG. 10, the display device 2 of this embodiment includes an edge cover film (a bank) 43 shaped into a frame. The edge cover film 43 covers edges of the first electrodes 22, and separates the light-emitting elements Xr, Xg, and Xb from one another. Moreover, in the display device 2 of this embodiment, the second electrode 25 is provided as a monolithic common electrode formed in common among all the light-emitting elements X.

As illustrated in FIG. 11, in the display device 2 of this embodiment, the edge cover film 43 includes inside: the third electrode TE; the fourth electrode FE; and a piezoelectric element unit (a stress applying unit) 51. The third electrode TE and the fourth electrode FE are, as illustrated in FIG. 5, provided along two facing sides of the edge cover film 43, and arranged in parallel with each other. Moreover, the piezoelectric element unit 51 is provided, for each of the light-emitting elements X, between the third electrode TE and the fourth electrode FE. That is, unlike the third electrode TE or the fourth electrode FE each shaped into a long strip whose dimension extends across light-emitting elements X arranged in line, the piezoelectric element unit 51 is shaped into a short strip whose dimension is shorter than the column dimension of one light-emitting element X, so that, as seen in FIG. 11, one functional layer 24 for each of the light-emitting elements X is horizontally sandwiched between piezoelectric element units 51.

Moreover, as exemplified in FIG. 11, one of the third electrode TE or the fourth electrode FE is provided toward one of two facing sides of the edge cover film 43, to face the functional layer 24. Furthermore, another one of the third electrode TE or the fourth electrode FE is provided toward another one of the two opposing sides of the edge cover film 43, to face the functional layer 24. As can be seen, the third electrode TE and the fourth electrode FE are provided inside the edge cover film 43 made of an insulating material such as polyimide or acrylic resin. Hence, the edge cover film 43 acts as the first insulating film and the second insulating film. Hence, as can be seen in the first embodiment, neither the third electrode TE nor the fourth electrode FE is not directly in contact with the functional layer 24. Even if a voltage is applied from the power supply 61 to the third electrode TE and the fourth electrode FE, carriers (electrons and holes) are not supplied from either the third electrode TE or the fourth electrode FE to the functional layer 24.

Moreover, the piezoelectric element unit 51 is made of, for example: quartz crystal, ZnO, MgO, or MgZnO; a nitride semiconductor of GaN, InN, AlN, or a mixed crystal of GaN, InN, and AlN; PZT; or $BaTiO_3$. When a voltage is applied to the third electrode TE and the fourth electrode FE, this piezoelectric element unit 51 produces a phenomenon of the inverse piezoelectric effect to develop stress, as seen in the first embodiment. The developed stress travels inside the edge cover film 43, and through the third electrode TE or the fourth electrode FE. Then, the stress is applied to the functional layer 24. Moreover, in this embodiment, the piezoelectric element unit 51 is provided inside the edge cover film 43. Such a structure allows an RLC resonance frequency to be utilized more easily than the structure according to the first embodiment, thereby making it possible to readily increase the stress to be applied to the functional layer 24.

Furthermore, in the display device 2 of this embodiment, unlike the electron-transport layer **24*d* of the first embodiment, the electron-transport layer 24*d* in this embodiment is, as illustrated in FIG. 11, provided monolithically in common among all the light-emitting elements X. In addition, in this embodiment, the electron-transport layer 24*d*** is capable of transporting electrons, and made of a material with low piezoelectricity (e.g., silicone) to the degree not to affect the light emission capability.

Note that, other than the above description, as seen in the electron-transport layer **24*d* of the first embodiment, the electron-transport layer 24*d* in this embodiment may also be made of a material exhibiting electron-transporting capability and piezoelectricity. In such a case, the stress applying unit is formed to both the piezoelectric element unit 51 and the electron-transport layer 24*d*, thereby making it possible to readily apply stress to the functional layer 24. Note that, in such a case, the piezoelectric element unit 51 inside the edge cover film (the bank) 43** is insulated, and does not function as an electron-transport layer.

Figure 12:
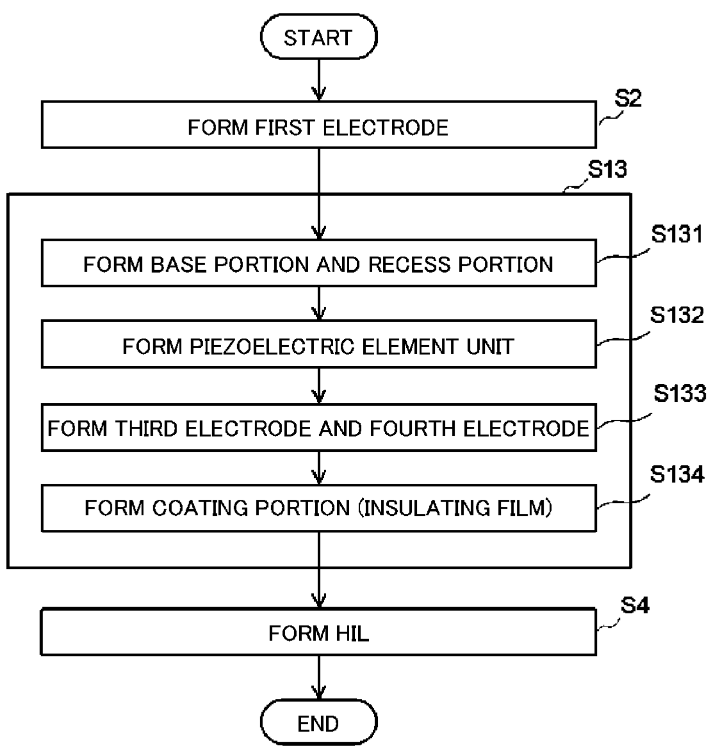
FIG. 12 is a flowchart showing a method for producing an essential configuration of the display device in FIG. 10.
Figure 13:
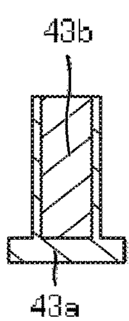
FIG. 13 illustrates steps to produce the essential configuration of the display device in FIG. 10.
Figure 13:
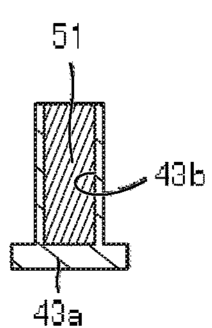
Figure 13:
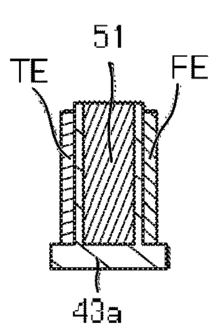
Figure 13:
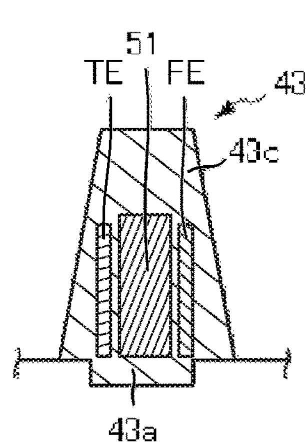

Here, also with reference to FIGS. 12 and 13, specifically described is a method for producing an essential configuration of the display device 2 of this embodiment. FIG. 12 is a flowchart showing the method for producing the essential configuration of the display device in FIG. 10. FIG. 13 illustrates steps to produce the essential configuration of the display device in FIG. 10. FIG. 13(*a*) to FIG. 13(*d*) illustrate a sequence of the steps to produce the essential configuration.

As shown in FIG. 12, in the method for producing the display device 2 of this embodiment, after the step of forming the first electrode 22 at Step S2, a step of forming the edge cover film 43 is carried out (Step S13). The edge cover film 43 includes inside the piezoelectric element unit (the stress applying unit) 51, the third electrode TE, and the fourth electrode FE.

This forming step first forms a base portion **43*a* of the edge cover film 43 and a recess portion 43*b* to be provided inside the base portion 43*a* (Step S131). That is, as illustrated in FIG. 13**(*a*), on the planarization film 21 (FIG. 11) and the first electrode 22 (FIG. 11), the base portion **43*a* is formed of the insulating material and the recess portion 43*b* is formed inside the base portion 43. The base portion 43*a* and the recess portion 43*b*** are formed by, for example, photolithography.

Next, the piezoelectric element unit 51 is formed inside the recess portion **43*b* (Step S132). Specifically, for example, $SiO_2$ is applied by sputtering to form quartz crystal inside the recess portion 43*b*. Alternatively, ZnO, MgO, or MgZnO, a nitride semiconductor of GaN, InN, AlN, or a mixed crystal of GaN, InN, and AlN, PZT, or a solution containing fine particles of PZT or $BaTiO_3$ is applied, or delivered in a form of droplets, inside the recess portion 43*b*. Thus, as illustrated in FIG. 13**(*b*), the piezoelectric element unit 51 is provided inside the recess portion **43*b***.

Next, the third electrode TE and the fourth electrode FE are formed in the base portion **43*a* (Step S133). Specifically, a conductive material is deposited on a side surface of the base portion 43*a* by, for example, sputtering or the CVD. As illustrated in FIG. 13**(*c*), the third electrode TE and the fourth electrode FE are formed to sandwich the piezoelectric element unit 51. Note that, unlike the third electrode TE or the fourth electrode FE of the first embodiment, the third electrode TE and the fourth electrode FE in this embodiment can be made of a conductive material not transparent to light.

Next, a coating portion 43*c* is formed to cover the piezoelectric element unit 51, the third electrode TE, and the fourth electrode FE (Step S134). Specifically, as illustrated in FIG. 13(*d*), the coating portion 43*c* made of the above insulating material is formed on the base portion 43*a* by, for example, photolithography, to cover the piezoelectric element unit 51, the third electrode TE, and the fourth electrode FE. Hence, with respect to the functional layer 24, an insulating film is formed to electrically insulate the third electrode TE and the fourth electrode FE. Thus, the edge cover film 43 is completed.

As can be seen, this embodiment can achieve the same advantageous effects as those of the first embodiment. Moreover, unlike the production method of the first embodiment shown in FIG. 6, in this embodiment, the insulating film forming step at Step S9 and the third electrode and fourth electrode forming step at Step S10 in FIG. 6 are included in the step of forming the edge cover film 43. Such a feature can simplify the production steps of this embodiment, compared with those of the first embodiment, and readily make light-emitting elements X and the display device 2 compact.

First Modification

Figure 14:
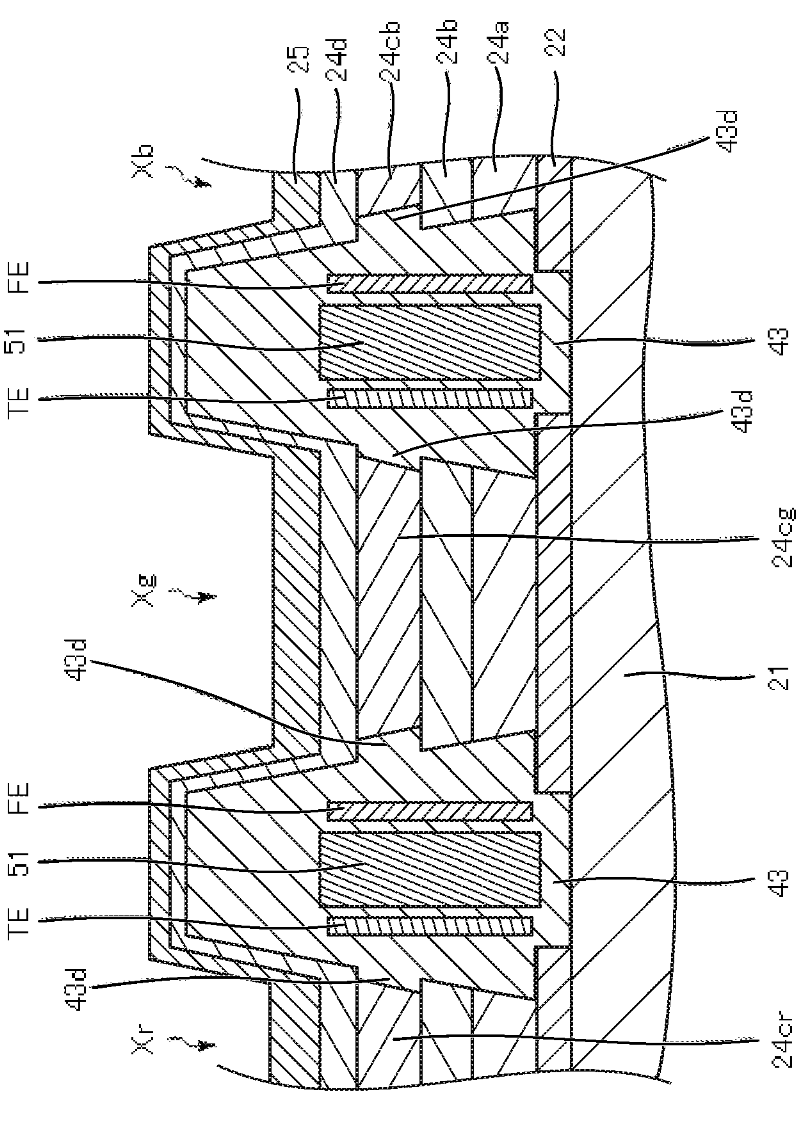
FIG. 14 is a drawing specifically illustrating an exemplary configuration of a first modification of the light-emitting element in FIG. 10.

FIG. 14 is a drawing specifically illustrating an exemplary configuration of a first modification of the light-emitting element in FIG. 10.

In FIG. 14, a main difference between this modification and the second embodiment is that, in this modification, the edge cover film (the bank) 43 is provided with a protrusion 43*d* protruding toward the light-emitting layer 24*c*. Note that like reference signs designate identical and corresponding constituent features between this modification and the second embodiment. Such features will not be elaborated upon repeatedly.

As illustrated in FIG. 14, in this modification, the protrusion 43*d* is provided to the edge cover film 43. This protrusion 43*d* is, as illustrated in FIG. 14, formed to protrude toward the light-emitting layer 24*c*. Hence, in this modification, when a voltage is applied to the third electrode TE and the fourth electrode FE, and the piezoelectric element unit 51 develops stress, the stress can certainly be propagated through the protrusion 43*d* to the light-emitting layer 24*c*. As a result, even though the functional layer 24 deteriorates over time, a bandgap of the light-emitting layer 24*c* can certainly be varied, thereby making it possible to ensure an improvement in quality of light emitted from the light-emitting elements X and of an image displayed by the display device 2.

Note that the above description shows a case where the protrusion 43*d* is provided to face, and abut on, the light-emitting layer 24*c*. However, this modification shall not be limited to such a case. This modification may provide any given configuration as long as the protrusion is provided to protrude toward at least one of a plurality of layers included in the functional layer 24. Note that, as described above, the protrusion protrudes preferably at least to the light-emitting layer 24*c*, thereby making it possible to readily improve quality of light emitted from the light-emitting elements X and an image displayed by the display device 2.

Second Modification

Figure 15:
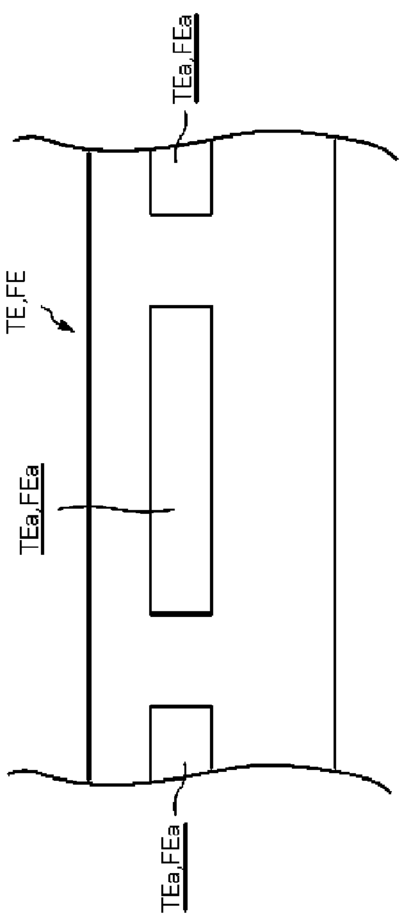
FIG. 15 is a plan view specifically illustrating exemplary configurations of a third electrode and a fourth electrode in a second modification of the light-emitting element in FIG. 10.

FIG. 15 is a plan view specifically illustrating exemplary configurations of a third electrode and a fourth electrode in a second modification of the light-emitting element in FIG. 10.

In FIG. 15, a main difference between this modification and the second embodiment is that, in this modification, the third electrode TE and the fourth electrode FE are respectively provided with an opening TEa and an opening FEa each positioned to face the corresponding light-emitting layer 24*c*. Note that like reference signs designate identical and corresponding constituent features between this modification and the second embodiment. Such features will not be elaborated upon repeatedly.

As illustrated in FIG. 15, in this modification, each of the third electrode TE and the fourth electrode FE is shaped into a long strip. As to light-emitting elements X arranged in line, each of the opening TEa and the opening FEa is formed in a position to face the light-emitting layer 24*c* of the corresponding light-emitting element X. The opening TEa and the opening FEa are filled with the insulating material of the coating portion 43*c* in the edge cover film 43. Hence, in this modification, when a voltage is applied to the third electrode TE and the fourth electrode FE, and the piezoelectric element unit 51 develops stress, the stress is propagated to the light-emitting layer 24*c* through the coating portion 43*c* included in the edge cover film 43 and filling the opening TEa or the opening FEa. As can be seen, this modification can reduce the number of interfaces provided between the piezoelectric element unit 51 and the light-emitting layer 24*c*, compared with the second embodiment. Thanks to such a feature, the stress can be propagated more efficiently from the piezoelectric element unit 51. As a result, even though the functional layer 24 deteriorates over time, a bandgap of the light-emitting layer 24*c* can certainly be varied, thereby making it possible to ensure an improvement in quality of light emitted from the light-emitting elements X and of an image displayed by the display device 2.

Note that the above description shows a case where the third electrode TE and the fourth electrode FE are respectively provided with the opening TEa and the opening FEa each facing the corresponding light-emitting layer 24*c*. However, this modification shall not be limited to such a case. This modification may provide any given configuration as long as at least one of the third electrode TE or the fourth electrode FE is provided with an opening. Note that, as described above, the opening TEa and the opening FEa, each facing the corresponding light-emitting layer 24*c*, are preferably provided respectively to the third electrode TE and the fourth electrode FE, thereby making it possible to readily improve quality of light emitted from the light-emitting elements X and of an image displayed by the display device 2.

Third Embodiment

Figure 16:
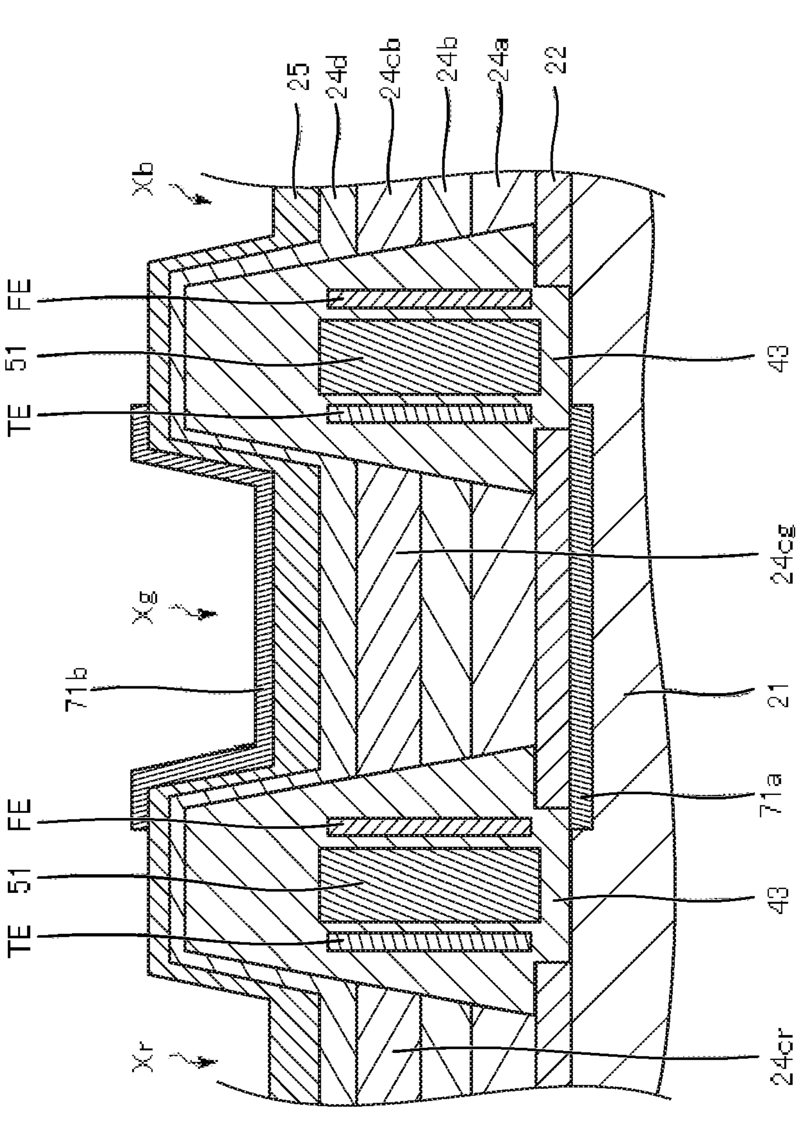
FIG. 16 is a drawing specifically illustrating an exemplary configuration of a light-emitting element according to a third embodiment of the disclosure.

FIG. 16 is a drawing specifically illustrating an exemplary configuration of a light-emitting element according to a third embodiment of the disclosure.

In FIG. 16, a main difference between this embodiment and the second embodiment is that, in this embodiment, a first reinforcing plate 71*a* and a second reinforcing plate 71*b* are provided to sandwich a light-emitting element X. Note that like reference signs designate identical and corresponding constituent features between this embodiment and the second embodiment. Such features will not be elaborated upon repeatedly. Moreover, for the sake of simplicity, FIG. 16 shows only the first reinforcing plate 71*a* and the second reinforcing plate 71*b* provided to the light-emitting element Xg. FIG. 16 omits illustrations of the first reinforcing plates 71*a* and the second reinforcing plates 71*b* provided to the light-emitting elements Xr and Xb.

In the display device 2 of this embodiment, as illustrated in FIG. 16, the first reinforcing plate 71*a* is formed in contact with a lower surface of the first electrode 22. Moreover, the second reinforcing plate 71*b* is formed in contact with an upper surface of the second electrode 25. In the light-emitting element Xg, the first electrode 22, the functional layer 24, and the second electrode 25 are sandwiched between the first reinforcing plate 71*a* and the second reinforcing plate 71*b*.

The first reinforcing plate 71*a* is made of a material harder than the first electrode 22. Moreover, the second reinforcing plate 71*b* is made of a material harder than the second electrode 25. Specifically, the first reinforcing plate 71*a* and the second reinforcing plate 71*b* are made of the same material as, for example, sapphire ($Al_2O_3$), reinforced glass, or a metal plate (such as Al, a stainless alloy, and Mo). Furthermore, of the first reinforcing plate 71*a* and the second reinforcing plate 71*b*, at least the second reinforcing plate 71*b* toward the light-emitting surface (the display surface) is made of a light-transparent material to minimize a decrease in light-emission capability (display capability). Note that, as described above, both the first reinforcing plate 71*a* and the second reinforcing plate 71*b* are preferably made of the same material, so that the number of components can be reduced. Moreover, other than the above description, the second reinforcing plate 71*b* can be formed monolithically in common among all the light-emitting elements X.

As can be seen, this embodiment can achieve the same advantageous effects as those of the second embodiment. Moreover, in this embodiment, the first reinforcing plate 71*a* and the second reinforcing plate 71*b* sandwich the light-emitting element X. Such a feature can more effectively apply stress from the piezoelectric element unit (the stress applying unit) 51 at least to the light-emitting layer 24*c*. As a result, even though the functional layer 24 deteriorates over time, a bandgap of the light-emitting layer 24*c* can certainly be varied, thereby making it possible to ensure an improvement in quality of light emitted from the light-emitting elements X and of an image displayed by the display device 2.

Fourth Embodiment

Figure 17:
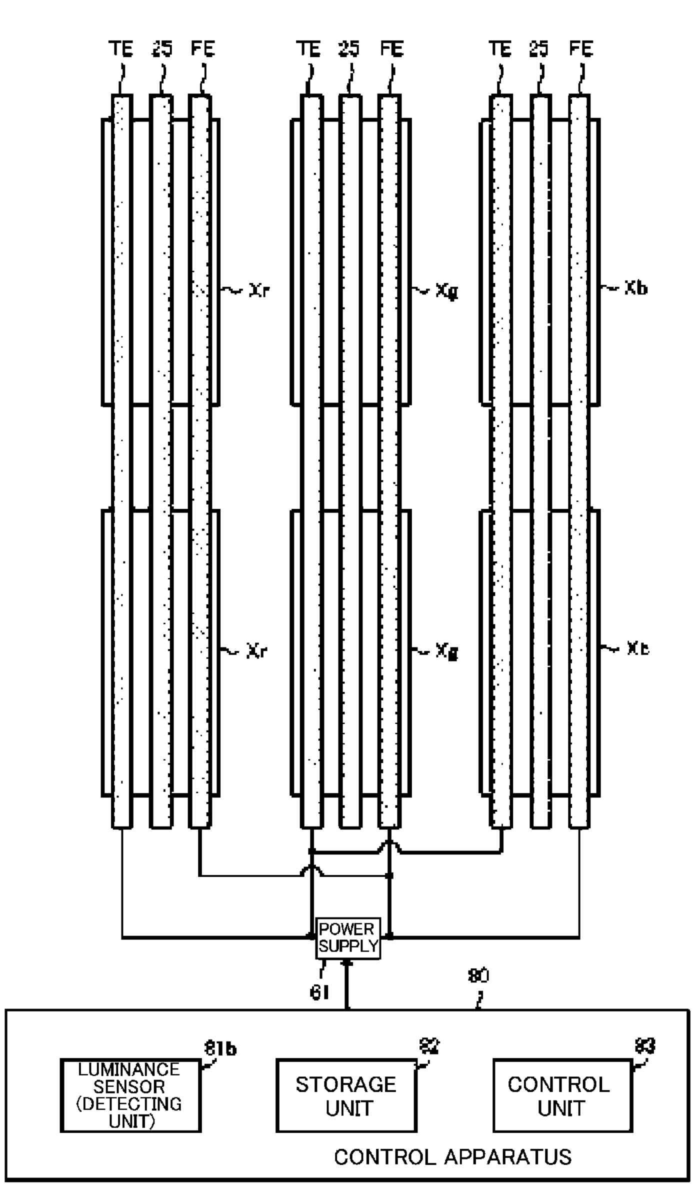
FIG. 17 is a plan view of an essential configuration of a light-emitting element according to a fourth embodiment of the disclosure.

FIG. 17 is a plan view of an essential configuration of a light-emitting element according to a fourth embodiment of the disclosure.

In FIG. 17, a main difference between this embodiment and the first embodiment is that, in this embodiment, a luminance sensor 81*b* is provided as the detecting unit to detect luminance of light to be emitted from the functional layer 24 (the light-emitting layer 24*c*). Note that like reference signs designate identical and corresponding constituent features between this embodiment and the first embodiment. Such features will not be elaborated upon repeatedly.

In the display device 2 of this embodiment, as illustrated in FIG. 17, the luminance sensor 81*b* is included in the control apparatus 80. This luminance sensor 81*b* in the display device 2 detects light emitted from the functional layer 24, specifically from the light-emitting layer 24*c*, and outputs a result of the detection to the control unit 83.

Moreover, in this embodiment, the threshold value information previously stored in the storage unit 82 is set so that, for example, a voltage to be applied to the third electrode TE and the fourth electrode FE is higher as the result of the detection (a measured luminance value) obtained by the luminance sensor 81*b* is lower. More specifically, if the result of the detection is up to C1 (e.g., 900) cd/cm$^2$, the voltage indication value is set to "A1 V". If the result of the detection exceeds C1 cd/cm$^2$ up to C2 (e.g., 1000) cd/cm$^2$, the voltage indication value is set to "A2 V". If the result of the detection exceeds C2 cd/cm$^2$, the voltage indication value is set to "0 V" (i.e., the power supply 61 does not apply a voltage to either the third electrode TE or the fourth electrode FE). Moreover, the voltage indication value is set larger as the value of the result of the measurement becomes smaller. (That is, the relationship "A1 V>"A2 V" holds.)

As can be seen, this embodiment can achieve the same advantageous effects as those of the first embodiment. That is, in this embodiment, depending on to what extent the deterioration of the functional layer 24 has advanced over time, when the luminance of light from the light-emitting layer 24*c* decreases, the control unit 83 can cause the third electrode TE and the fourth electrode FE to apply a voltage corresponding to the extent of the deterioration over time, using the result of the detection obtained from the luminance sensor (the detecting unit) 81*b* and the threshold value information stored in the storage 82. As a result, as seen in the first embodiment, this embodiment also makes it possible to appropriately reduce a decrease in output of light even though the functional layer 24 deteriorates over time.

Fifth Embodiment

Figure 18:
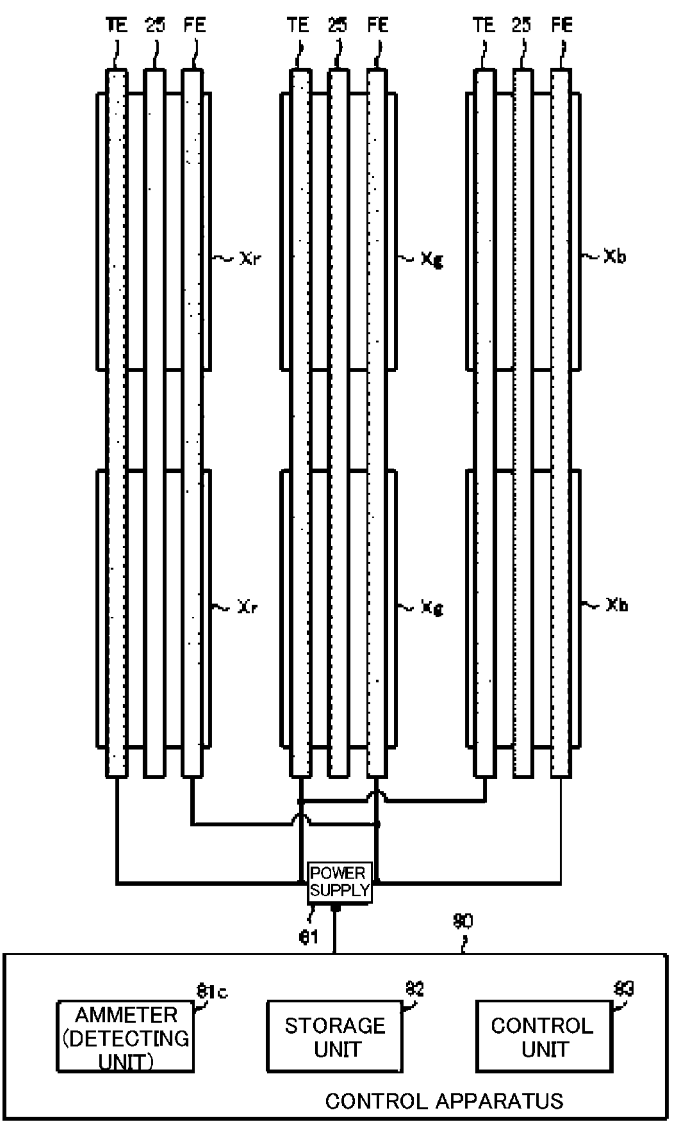
FIG. 18 is a plan view of an essential configuration of a light-emitting element according to a fifth embodiment of the disclosure.

FIG. 18 is a plan view of an essential configuration of a light-emitting element according to a fifth embodiment of the disclosure.

In FIG. 18, a main difference between this embodiment and the first embodiment is that, in this embodiment, an ammeter 81*c* is provided as the detecting unit to detect a current flowing in the functional layer 24. Note that like reference signs designate identical and corresponding constituent features between this embodiment and the first embodiment. Such features will not be elaborated upon repeatedly.

In the display device 2 of this embodiment, as illustrated in FIG. 18, the ammeter 81*c* is included in the control apparatus 80. This ammeter 81*c* in the display device 2 detects a current flowing in the functional layer 24, and outputs a result of the detection to the control unit 83.

Moreover, in this embodiment, suppose, in the functional layer 24, the resistance becomes lower and the (drive) current becomes larger when, for example, the functional layer 24 deteriorates over time. If the result of the detection obtained by the ammeter 81*c* is up to an A1 ampere (e.g., 90 nA), the threshold value information previously stored in the storage 82 indicates that the voltage indication value is set to "0 V" (i.e., the power supply 61 does not apply a voltage to either the third electrode TE or the fourth electrode FE). If the result of the detection exceeds the A1 ampere up to an A2 ampere (e.g., 100 nA), the threshold value information indicates that the voltage indication value is set to "A1 V". If the result of the detection exceeds an An ampere up to an An+1, the threshold value information indicates that the voltage indication value is set to "An V" (n is an integer of 2 or greater). Moreover, the voltage indication value is set larger as the value of the result of the measurement becomes larger. (That is, the relationship "A1 V<"An V" holds.) Meanwhile, suppose, in the functional layer 24, the resistance becomes higher and the (drive) current becomes smaller when the functional layer 24 deteriorates over time. If the result of the detection obtained by the ammeter 81*c* is up to the A1 ampere, the voltage indication value is set to "A1 V'". If the result of the detection exceeds the A1 ampere up to the A2 ampere, the threshold value information indicates that the voltage indication value is set to “A2 V'”. Moreover, if the result of the detection exceeds the A2 ampere, the voltage indication value is set to “0 V” (i.e., the power supply 61 does not apply a voltage to either the third electrode TE or the fourth electrode FE). Moreover, the voltage indication value is set larger as the value of the result of the measurement becomes smaller. (That is, the relationship “A1 V'>“A2 V'” holds.)

As can be seen, this embodiment can achieve the same advantageous effects as those of the first embodiment. That is, in this embodiment, depending on to what extent the deterioration of the functional layer 24 has advanced over time, when the current (a drive current) flowing in the light-emitting layer 24*c* increases, the control unit 83 can cause the third electrode TE and the fourth electrode FE to apply a voltage corresponding to the extent of the deterioration over time, using the result of the detection obtained from the ammeter (the detecting unit) 81*c* and the threshold value information stored in the storage 82. As a result, as seen in the first embodiment, this embodiment also makes it possible to appropriately reduce a decrease in output of light even though the functional layer 24 deteriorates over time.

Sixth Embodiment

Figure 19:
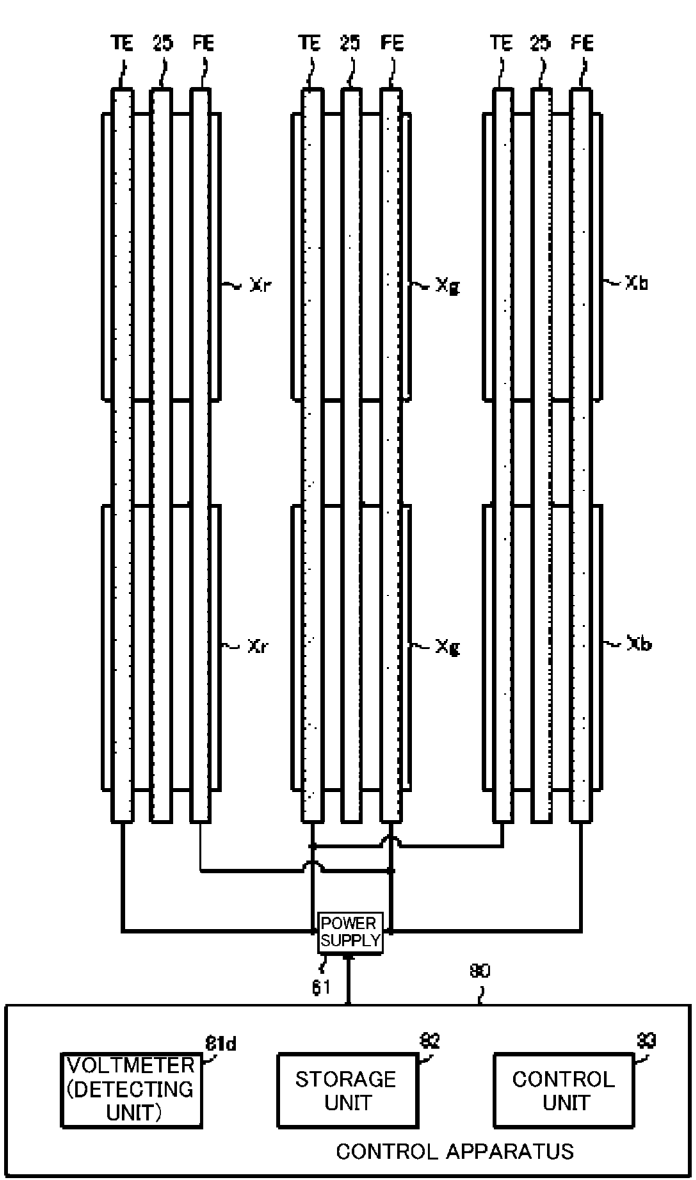
FIG. 19 is a plan view of an essential configuration of a light-emitting element according to a sixth embodiment of the disclosure.

FIG. 19 is a plan view of an essential configuration of a light-emitting element according to a sixth embodiment of the disclosure.

In FIG. 19, a main difference between this embodiment and the first embodiment is that, in this embodiment, a voltmeter 81*d* is provided as the detecting unit to detect a voltage applied to the functional layer 24. Note that like reference signs designate identical and corresponding constituent features between this embodiment and the first embodiment. Such features will not be elaborated upon repeatedly.

In the display device 2 of this embodiment, as illustrated in FIG. 19, the voltmeter 81*d* is included in the control apparatus 80. This voltmeter 81*d* in the display device 2 detects a voltage applied to the functional layer 24, and outputs a result of the detection to the control unit 83.

Moreover, in this embodiment, if the result of the detection obtained by the voltmeter 81*d* is up to a V1 volt, the threshold value information previously stored in the storage 82 indicates that the voltage indication value is set to “0 V” (i.e., the power supply 61 does not apply a voltage to either the third electrode TE or the fourth electrode FE). If the result of the detection exceeds the V1 volt up to a V2 volt, the threshold value information indicates that the voltage indication value is set to “A1 V”. If the result of the detection exceeds a Vn volt up to a Vn+1 volt, the threshold value information indicates that the voltage indication value is set to “An V” (n is an integer of 2 or greater). Moreover, the voltage indication value is set larger as the value of the result of the measurement becomes larger. (That is, the relationship “A1 V<“An V” holds.)

As can be seen, this embodiment can achieve the same advantageous effects as those of the first embodiment. That is, in this embodiment, depending on to what extent the deterioration of the functional layer 24 has advanced over time, when the voltage (a drive voltage) applied to the light-emitting layer 24*c* increases, the control unit 83 can cause the third electrode TE and the fourth electrode FE to apply a voltage corresponding to the extent of the deterioration over time, using the result of the detection obtained from the voltmeter (the detecting unit) 81*d* and the threshold value information stored in the storage 82. As a result, as seen in the first embodiment, this embodiment also makes it possible to appropriately reduce a decrease in output of light even though the functional layer 24 deteriorates over time.

Note that, other than the above description, the above embodiments and modifications may be combined appropriately.

Note that, the above description shows that each light-emitting element X has a known structure; that is, an anode as the first electrode 22 is provided toward the base material 12, and a cathode as the second electrode 25 is provided toward the display surface. However, in this embodiment, the light-emitting element X shall not be limited to such a structure. For example, the light-emitting element X may have an inverted structure; that is, a cathode as the first electrode 22 is provided toward the base material 12, and an anode as the second electrode 25 is provided toward the display surface. In the case of this inverted structure, the first charge-transport layer is the above electron-transport layer, and the second charge-transport layer is the above hole-transport layer.

Moreover, the above description shows the display device 2 of the top emission type; that is, the second electrode 25 is made of an electrode material highly transparent to light, the first electrode 22 is made of an electrode material reflective to light, and the light from the light-emitting layer 24*c* is emitted across from the base material 12 (emitted from above). However, this embodiment shall not be limited to such a configuration. For example, the display device 2 may be of the bottom emission type; that is, the first electrode 22 may be made of an electrode material highly transparent to light, the second electrode 25 may be made of an electrode material reflective to light, and the light from the light-emitting layer 24*c* may be emitted from toward the base material 12 (emitted from below).

Note that, the above description describes a display device including a first light-emitting element, a second light-emitting element, and a third light-emitting element corresponding to RGB colors. However, the disclosure shall not be limited to such a display device. For example, the disclosure may be applied to a display device further including a fourth light-emitting element emitting, for example, a yellow (Y) light.

INDUSTRIAL APPLICABILITY

The disclosure is useful for a light-emitting element and a display device that can reduce a decrease in light emission efficiency and emit the light in high quality, even though a functional layer deteriorates over time.

The invention claimed is:

1. A light-emitting element including a first electrode, a second electrode, and a functional layer provided between the first electrode and the second electrode, the light-emitting element comprising:

a third electrode provided to the functional layer through a first insulating film;

a fourth electrode provided to the functional layer through a second insulating film; and a stress applying unit made of a piezoelectric material, and configured to apply stress to the functional layer in response to an application of a voltage to the third electrode and the fourth electrode, wherein:

at least one of the third electrode or the fourth electrode is provided with an opening, the functional layer includes:

a light-emitting layer, a first charge-transport layer provided between the first electrode and the light-emitting layer, and a second charge-transport layer provided between the second electrode and the light-emitting layer, and the second charge-transport layer is in contact with the first insulating film and the second insulating film, and is made of the piezoelectric material to also act as the stress applying unit.

2. A light-emitting element including a first electrode, a second electrode, and a functional layer provided between the first electrode and the second electrode, the light-emitting element comprising:

a third electrode provided to the functional layer through a first insulating film;

a fourth electrode provided to the functional layer through a second insulating film; and a stress applying unit made of a piezoelectric material, and configured to apply stress to the functional layer in response to an application of a voltage to the third electrode and the fourth electrode, wherein:

at least one of the third electrode or the fourth electrode is provided with an opening, the functional layer includes:

a light-emitting layer, a first charge-transport layer provided between the first electrode and the light-emitting layer, and a second charge-transport layer provided between the second electrode and the light-emitting layer, the second electrode is provided above the second charge-transport layer, and the third electrode and the fourth electrode are, respectively, in contact with the first insulating film and the second insulating film that are provided above the second charge-transport layer, such that the third electrode and the fourth electrode sandwich the second electrode.

3. A light-emitting element including a first electrode, a second electrode, and a functional layer provided between the first electrode and the second electrode, the light-emitting element comprising:

a third electrode provided to the functional layer through a first insulating film;

a fourth electrode provided to the functional layer through a second insulating film;

a stress applying unit made of a piezoelectric material, and configured to apply stress to the functional layer in response to an application of a voltage to the third electrode and the fourth electrode; and a bank shaped into a frame and surrounding the functional layer, wherein:

at least one of the third electrode or the fourth electrode is provided with an opening, and the third electrode, the fourth electrode, and the stress applying unit are provided within the bank.

4. The light-emitting element according to claim 3, wherein one of the third electrode or the fourth electrode is positioned close to one of two facing sides of the bank, and another one of the third electrode or the fourth electrode is positioned close to another one of the two facing sides of the bank.

5. The light-emitting element according to claim 3, wherein the functional layer includes a plurality of layers, and the bank is provided with a protrusion protruding at least toward one of the plurality of layers.

6. The light-emitting element according to claim 3, wherein the stress applying unit provided inside the bank is made of:

quartz crystal, ZnO, MgO, or MgZnO;

GaN, InN, AlN, or a mixed crystal of GaN, InN, and AlN;

lead zirconate titanate (PZT); or barium titanate ($BaTiO_3$).

* * * * *